(12) United States Patent
Al-Shamma

(10) Patent No.: US 10,692,570 B2
(45) Date of Patent: Jun. 23, 2020

(54) NEURAL NETWORK MATRIX MULTIPLICATION IN MEMORY CELLS

(71) Applicant: SanDisk Technologies LLC, Addison, TX (US)

(72) Inventor: Ali Al-Shamma, San Jose, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 0 days.

(21) Appl. No.: 16/195,175

(22) Filed: Nov. 19, 2018

(65) Prior Publication Data

US 2020/0020393 A1    Jan. 16, 2020

Related U.S. Application Data

(60) Provisional application No. 62/696,459, filed on Jul. 11, 2018.

(51) Int. Cl.
| | |
|---|---|
| G11C 11/56 | (2006.01) |
| G11C 16/26 | (2006.01) |
| G06F 17/16 | (2006.01) |
| G11C 16/10 | (2006.01) |
| G06N 3/02 | (2006.01) |
| G11C 16/08 | (2006.01) |

(52) U.S. Cl.
CPC ......... *G11C 11/5628* (2013.01); *G06F 17/16* (2013.01); *G06N 3/02* (2013.01); *G11C 11/5642* (2013.01); *G11C 16/08* (2013.01); *G11C 16/10* (2013.01); *G11C 16/26* (2013.01)

(58) Field of Classification Search
CPC . G11C 11/5628; G11C 11/5642; G11C 16/10; G11C 16/26; G06F 17/16; G06N 3/02

USPC ........................................ 365/185.01–185.33
See application file for complete search history.

(56) References Cited

U.S. PATENT DOCUMENTS

| | | | |
|---|---|---|---|
| 2004/0141371 A1* | 7/2004 | Owen ..................... | G11C 16/10 365/185.02 |
| 2004/0145361 A1* | 7/2004 | Owen ..................... | G05F 3/262 323/313 |
| 2004/0145949 A1* | 7/2004 | Owen ................ | G11C 16/3468 365/185.28 |

(Continued)

OTHER PUBLICATIONS

Simonyan, Karen et al, "Very Deep Convolutional Networks for Large-Scale Image Recognition," published as a conference paper at ICLR 2015, Visual Geometry Group-Department of Engineering Science, University of Oxford, Apr. 10, 2015, 14 pages.

*Primary Examiner* — Harry W Byrne
(74) *Attorney, Agent, or Firm* — Volpe and Koenig, P.C.

(57) ABSTRACT

Various examples for accelerating multiplication operations are presented, which can be employed in neural network operations, among other applications. In one example, a circuit comprises a non-volatile memory cell, and an input circuit coupled to a gate terminal of the non-volatile memory cell. The input circuit is configured to ramp a control voltage applied to the gate terminal at a ramp rate representing a multiplicand value. An output circuit coupled to an output terminal of the non-volatile memory cell and is configured to generate an output pulse based on the control voltage satisfying a threshold voltage of the non-volatile memory cell, where the output pulse has a duration comprising the multiplicand value multiplied by a multiplier value represented by the threshold voltage.

6 Claims, 10 Drawing Sheets

(56) References Cited

U.S. PATENT DOCUMENTS

2004/0160823 A1\* 8/2004 Owen ................ G11C 16/3468
                                                365/185.1
2007/0013430 A1\* 1/2007 Owen .................... G11C 7/062
                                                327/333

\* cited by examiner

NEURAL NETWORK MATRIX MULTIPLICATION IN MEMORY CELLS

RELATED APPLICATIONS

This application hereby claims the benefit of and priority to U.S. Provisional Patent Application 62/696,459, titled "NEURAL NETWORK ACCELERATION WITH IN-MEMORY MATRIX MULTIPLIER," filed Jul. 11, 2018, which is hereby incorporated by reference in its entirety.

TECHNICAL FIELD

Aspects of the disclosure are related to the field of artificial neural networks.

BACKGROUND

Artificial neural networks (ANN) can be formed from individual artificial neurons that are emulated using software, integrated hardware, or other discrete elements. Neuromorphic computing can employ ANNs, which focuses on using electronic components such as analog/digital circuits in integrated systems to mimic the human brain, and to attempt a greater understanding of the neuro-biological architecture of the neural system. Neuromorphic computing emphasizes implementing models of neural systems to understand how the morphology of individual neurons, synapses, circuits, and architectures lead to desirable computations. Such bio-inspired computing offers enormous potential for very low power consumption and high parallelism.

Many neuromorphic computing implementations use semiconductor based random-access memory to emulate the behavior of biological neurons. More recently, emerging non-volatile memory devices, including phase change memory, resistive memory, and magnetic random-access memory, have been proposed to be used to emulate biological neurons as well. However, several mathematical operations used to implement neuromorphic computing and artificial neural networks require additional circuitry beyond the corresponding artificial neurons. This additional circuitry can inhibit large-scale integration efforts for artificial neural networks, which might increase footprint and cost for implementing artificial neural networks. Some example mathematical operations include convolution operations, multiplication operations, or matrix multiplication operations.

OVERVIEW

Various examples for accelerating multiplication operations are presented, which can be employed in neural network operations, among other applications. In one example, a circuit comprises a non-volatile memory cell, and an input circuit coupled to a gate terminal of the non-volatile memory cell. The input circuit is configured to ramp a gate voltage applied to the gate terminal at a ramp rate representing a multiplicand value. An output circuit coupled to an output terminal of the non-volatile memory cell and is configured to generate an output pulse based on the gate voltage satisfying a threshold voltage of the non-volatile memory cell, where the output pulse has a duration comprising the multiplicand value multiplied by a multiplier value represented by the threshold voltage.

BRIEF DESCRIPTION OF THE DRAWINGS

Many aspects of the disclosure can be better understood with reference to the following drawings. While several implementations are described in connection with these drawings, the disclosure is not limited to the implementations disclosed herein. On the contrary, the intent is to cover all alternatives, modifications, and equivalents.

DETAILED DESCRIPTION

Figure 1:
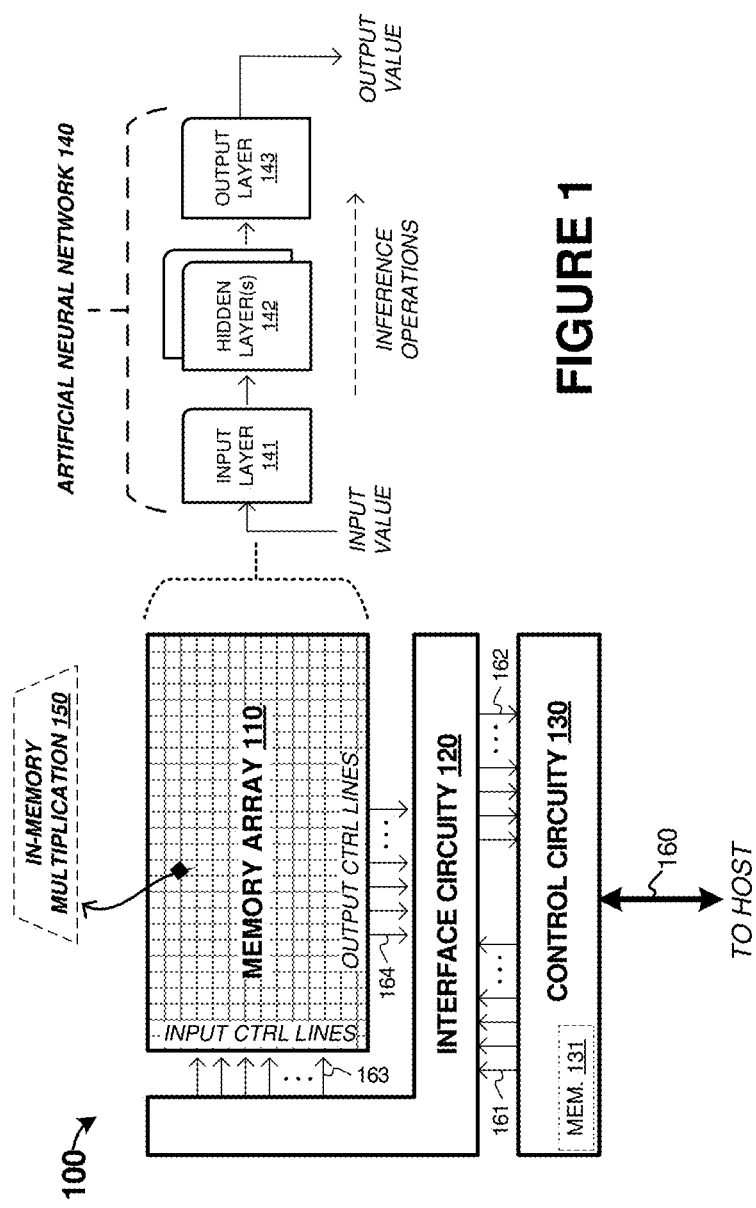
FIG. 1 illustrates an artificial neural network system in an implementation.

Discussed herein are various examples for accelerating multiplication operations in artificial neural networks. Multiplication operations, such as matrix multiplication, are used in many artificial neural networks, among other applications. The examples herein include enhanced circuitry, systems, and techniques to perform multiplication operations directly in memory. Specifically, a non-volatile memory (NVM) cell gate terminal is modulated based on an input multiplicand, while a multiplier is represented as a stored value within the NVM cell. The modulation can comprise a voltage ramp applied as a gate voltage to a gate terminal of the NVM cells. A state of the NVM cell is related to a multiplication product of the input multiplicand and multiplier value, thus performing in-cell or in-memory multiplication. Various output circuitry, such as sense amplifiers, buffers, adders, and counters can condition and combine individual multiplier outputs to compute a matrix multiplication result. Advantageously, a multiplication result can be completed in-memory and largely concurrent with an input voltage ramping operation.

As discussed below, various combinations of in-memory multiplication circuits can be employed in artificial neural networks (ANNs). ANN have been developed to process sets of complex data using techniques deemed similar to biological neurons. Biological neurons characteristically produce an output in response to various synaptic inputs to the neuron cell body, and some forms of artificial neurons attempt to emulate this behavior. Complex networks of artificial neurons can thus be formed, using artificial neural connections among artificial neurons as well as properties of these artificial neurons to process large sets of data or perform tasks too complex for conventional data processors, such as machine learning.

ANNs can be formed from individual artificial neurons that are emulated using software, or from integrated hardware and discrete circuit elements. As discussed herein, artificial neurons can comprise individual memory elements, such as non-volatile memory elements, or might be represented using other types of memory elements or software elements. Artificial neurons are interconnected using artificial neural connections, which can be referred to as neural connections. These neural connections are designed to emulate biological neural synapses and axons which interconnect biological neurons. These neural connections can comprise electrical interconnects, such as wires, traces, circuitry, and various discrete or integrated logic or optical interconnects. When memory elements are employed to form artificial neurons, then these neural connections can be formed in part by control lines of any associated memory array. These control lines can include input control lines that introduce data to artificial neurons, and output control lines which receive data from artificial neurons. In specific implementations, the control lines may comprise word lines and bit lines of a memory array.

Various types of ANNs have been developed, which typically relate to topologies for connecting artificial neurons as well as how data is processed or propagated through an ANN. For example, feedforward ANNs propagate data through sequential layers of artificial neurons in a 'forward' manner, which excludes reverse propagation and loops. Fully-connected ANNs have layers of artificial neurons, and each artificial neuron is each connected to all artificial neurons of a subsequent layer. Convolutional neural networks (CNNs) are formed by multiple layers of artificial neurons which are fully connected and propagate data in a feed-forward manner.

The process of propagating and processing data through an ANN to produce a result is typically referred to as inference. However, many ANNs must first be trained before data sets can be processed through the ANN. This training process can establish connectivity among individual artificial neurons as well as data processing properties of each artificial neuron. The data processing properties of artificial neurons can be referred to as weights or synaptic weights. Synaptic weights indicate a strength or amplitude of a connection among two artificial neurons. This can correspond to an amount of influence that firing a first artificial neuron has on another artificial neuron.

Various implementations have been developed to form ANNs that execute machine learning tasks, among other data processing tasks within an ANN framework. For example, a conventional central processing unit (CPU) can typically process very complex instructions efficiently but can be limited in the amount of parallelism achieved. However, in machine learning computation, especially training tasks, the basic operation is vector matrix multiplication, which is a simple task performed an enormous amount of times. A graphics processing unit (GPU), which has started to gain favor over CPUs, uses a parallel architecture and can handle many sets of very simple instructions. Another emerging implementation uses an application specific integrated circuits (ASIC), which can implement a tensor processing unit (TPU) that is efficient at executing one specific task. As machine learning becomes more integrated into more applications, interest has grown into making special purpose circuitry that can efficiently handle machine learning tasks.

Neuromorphic computing is often employed for machine learning applications supported by ANNs, and focuses on using electronic components such as analog/digital circuits in very-large-scale-integration (VLSI) systems to attempt to mimic the human brain, especially in trying to understand and learn from the neuro-biological architecture of the neural system. Neuromorphic computing emphasizes on implementing models of neural systems and understand how the morphology of individual neurons, synapses, circuits, and architecture lead to desirable computations. Such biologically inspired computing offers enormous potential for very low power consumption and high parallelism. Related research has been done to study the spiking neural networks, and synaptic learning rules such as spike-timing dependent plasticity.

Non-volatile memory (NVM) devices can be employed to emulate synaptic weights in ANNs. These NVM devices include flash memory elements, phase change memory (PCM), resistive random-access memory (RRAM or ReRAM), and magnetic random-access memory (MRAM) formed from magnetic tunnel junctions (MTJs). NVM devices can offer very high density and connectivity due to a correspondingly small footprint. While some of these NVM devices are two-terminal devices, the examples herein relate to arrangements of three-terminal devices. Three-terminal devices include three externally-accessible electrical terminals, typically referred to as a gate, drain, and source. Three-terminal devices include flash memory cells, PCM cells, ReRAM cells, and some forms of MRAM cells. Additionally, some three-terminal memory cells, such as flash memory cells, can be arranged into NAND and NOR topologies. NAND topologies are usually arranged such that lines of sequentially-coupled devices share a common output bit line. In contrast, NOR topologies are typically arranged to have outputs of each memory cell accessible via individual bit lines.

In some of the implementations below, NOR-based flash memory cells are employed to store representations of synaptic weights as storage states encoded by the threshold voltage of the NOR flash memory cell. The implementations below can also apply to other architecture types and memory types that store synaptic weights. By using NOR-based memory flash cells to store representations of synaptic weights, associated gate terminals can be modulated or ramped to achieve a multiplier operation for acceleration of artificial neural networks. NOR cell-based flash memory architectures typically provide for individually-addressable memory cells, providing for individual control of gate terminal voltages and individual access of output states or values. For comparison, NAND cell-based flash memory architectures might employ different control circuitry than NOR architectures since individual cells in NAND architectures are typically not uniquely accessible or addressable as cells in NOR architectures. Although the types of NOR cells can vary, in the examples below, quad level cell (QLC) NOR cells are employed due in part to storing four data bits per cell. Different types of NOR cells might instead be employed, such as single level cells (SLC) storing 1 bit per cell, multi-level cells (MLC) storing 2 bits per cell, and tri-level cells (TLC) storing 3 bits per cell. Adjustments to the size of matrix multiplication operations or to a quantity of cells employed per multiplication unit can be made based in part on a quantity of bits per cell in the particular NVM cells deployed.

Regardless of the memory cell type, three-terminal NVM cells representing synaptic weights of artificial neural networks will be considered below, although the enhanced circuitry and techniques can be applied across other circuit types and ANN topologies. Individual NVM cells can be formed into large arrays interconnected via control lines coupled to the NVM cells. In some examples, these control lines can include bit line and word line arrangements, but the control lines, in other embodiments, can include other elements and interfaces with other memory array arrangements. In the examples herein, NVM arrays are employed to implement various types of ANNs.

Specifically, NVM cells can be organized into addressable arrays of artificial neurons used to form an ANN. Control line connections can be used to write and read the NVM cells in an array. Also, logically subdivisions made within the NVM array can form logical sub-units of an ANN, typically referred to as layers. These layers may each comprise an arbitrary quantity of NVM cells, which typically are determined by a desired quantity of artificial neurons, or nodes, for each layer. Typically, the arbitrary quantity of NVM cells is the same in each layer, but other embodiments may use different numbers of NVM cells in each layer. In some examples, nodes of each layer can comprise entire memory pages of an NVM array, or might span multiple memory pages. Furthermore, nodes of a layer might instead only employ a subset of the NVM cells for particular memory pages, and thus a single memory page might be shared among layers. In further examples, the NVM cells might not employ traditional memory page organization, and instead comprise a 'flat' array of column/row addressable elements.

When employed, ANN layers can be combined into an arrangement called a deep neural network (DNN), among other arrangements. Deep neural networks typically include an input layer, and output layer, and one or more intermediate layers between the input and output layers. These intermediate layers are referred to as hidden layers. Deep neural networks are popular in machine learning, especially for image classification, object detection or speech recognition applications. Deep neural networks are one of the most widely used deep learning techniques. A subset of DNNs comprise deep feedforward neural networks like convolutional neural networks (CNNs), multi-layer perceptrons (MLPs), or Recurrent Neural Networks (RNNs). CNNs, among other types, are suitable for processing visual patterns such as images used in image recognition operations. Recurrent deep neural networks like long short-term memory (LSTM) are good at processing temporal data like speech. As image recognition-based on CNNs encounter more applications, there is an increased demand for lower cost solutions. Existing hardware implementations tend to be processor based (e.g. a CPU), where data is constantly shuttled between main memory and the processor in order to perform a high number of matrix multiplications. The enhanced compute-in-memory examples herein can advantageously perform matrix multiplication operations in a single integrated circuit device.

Neural network inference operations can involve fetching a weight matrix and multiplying with an input matrix. In the examples herein, such multiplication can be performed in-memory using NVM memory cells. In-memory computation comprises using memory cells themselves for computation of multiplication products. Although the examples herein focus on individual multiplications as well as matrix multiplications, the concepts described herein can be applied for multiplying matrices of various sizes. For example, matrices having a 3×3 size are often employed as convolutional filters. A specific example comprises a 3×3 input matrix, such as a pixel slice of an image, convoluted with a 3×3 weighted filter matrix to produce a 3×3 output matrix.

Turning now to circuit structures that can be used to implement artificial neural networks with enhanced in-memory multiplication features, FIG. 1 is presented. FIG. 1 illustrates schematic view 100 with memory array 110 employed as an NVM array-based synaptic weight array, along with peripheral circuitry to realize one or more layers in a deep neural network. Artificial neural network (ANN) 140 is shown as an example deep neural network, such a convolutional neural network (CNN), but could instead be configured as a different type of artificial neural network. Furthermore, when memory array 110 is controlled according to the techniques discussed herein, memory array 110 implements in-memory multiplication features 150.

Peripheral circuitry can include interface circuitry 120 and control circuitry 130, which comprise example circuitry to at least interconnect and operate a synaptic weight array for one or more layers in an artificial neural network. Also shown in FIG. 1 are input control lines 163 and output control lines 164, which comprise control lines for accessing memory array 110. Input control lines 163 are employed to introduce signals or data to each layer of ANN 140 formed by the artificial neurons of memory array 110. Output control lines 164 are employed to read out resultant signals or data from each layer of ANN 140.

Interface circuitry 120 comprises various interconnection circuitry comprising line drivers, lines, switches, ramp circuitry, sense amplifiers, analog or digital accumulators, analog-to-digital conversion circuitry, counters, adders, digital logic, or other circuitry. Elements of interface circuitry 120 are used to drive input control lines 163, monitor/read signals or values presented on output control lines 164, and perform manipulations using those signals or values. Interconnection circuitry among interface circuitry 120 may include electrical connections made among control lines of memory array 110 to create one or more ANN layers among corresponding NVM cells, among other configurations. These control lines are employed by interface circuitry 120 to access the individual NVM cells, which might be further organized into memory pages and the like. In some examples, interconnection among layers of the ANN can be formed using logical or physical connections established by interface circuitry 120. In other examples, this interconnection can instead occur in control circuitry 130.

In specific examples, the input control lines might comprise word lines of an NVM array which are coupled to gate terminals of NVM cells, and the output control lines might comprise bit lines of an NVM array coupled to output terminals of individual NVM cells. However, control lines 163-164 can correspond to other arrangements when different memory technologies are employed or different physical arrangements than row/column configurations. For example, control lines might couple to individual memory cells when non-arrayed configurations of artificial neurons are employed, or when discrete memory cells are employed.

Control circuitry 130 comprises various circuitry and processing elements used for introduction of input signals to memory array 110 and interpretation of output signals received from memory array 110. The circuitry and processing elements can include matrix multiplication value input/output, activation functions, softmax processing elements, logit vector averaging circuitry, and storage circuitry. Control circuitry 130 can provide instructions, commands, or data over control lines 161 to interface circuitry 120. Control circuitry 130 can receive resultant data determined by memory array 110 or interface circuitry 120 over lines 162. Interface circuitry 120 can apply combinations, additions, counts, adjustments, or signal interpretations to the signaling presented by output control lines 164 before transfer to control circuitry 130. Output data can be transmitted to one or more external systems, such as a host system, over link 160. Moreover, input data can originate over link 160 from one or more external systems before training or inference by the ANN.

Control circuitry can also include one or more memory elements or storage elements, indicated in FIG. 1 by memory 131. Memory 131 might comprise volatile or non-volatile memory devices or memory spaces. In one example, memory 131 stores multiplication input values which can represent or be derived from elements of one or more input matrices. These input values can be used in one or more matrix multiplication operations involving memory array 110. Although the input values might comprise input ramp parameters for matrix multiplication elements, other representations of input values can be stored. In further examples, memory 131 is employed as a buffer to store synaptic weights for artificial neurons of an ANN. Control circuitry 130 can load synaptic weights (or representations thereof) from memory 131 into NVM cells of memory array 110 prior to introduction of input data to the ANN layers. Memory 131 can also be configured to store input data and output data. This output data might comprise multiplication results, intermediate results for use between layers, or logit vectors produced by an output layer of the ANN before introduction to a softmax process. Moreover, memory 131 can store output probabilities after logit vectors have been normalized by a softmax process.

Memory array 110 comprises an array of memory devices, specifically non-volatile memory devices. In this example, these NVM devices comprise three-terminal memory devices having at least gate, source, and drain terminals, or equivalent. Three-terminal NVM devices can comprise flash memory cells (NOR/NAND), ReRAM, MRAM, PCM, or other three-terminal memory device technologies. The memory devices may be connected into an array of columns and rows of memory devices accessible using selected word lines and bit lines. However, other memory cell arrangements might be employed and accessed using input control lines 163 and output control lines 164. Memory array 110 can be used to implement a single layer of an artificial neural network, or instead might implement a multi-layer ANN. Each layer of an ANN is comprised of a plurality of nodes or artificial neurons. Each artificial neuron corresponds to at least one NVM cell in memory array 110. In operation, individual NVM cells in memory array 110 store synaptic weights representing a weighting matrix, loaded from memory 131 by control circuitry 130, with values potentially established by training operations.

FIG. 1 also includes an example multi-layer ANN 140 formed within memory array 110, as shown in configuration 101. Each layer of ANN 140 is comprised of a plurality of nodes or artificial neurons. Each artificial neuron corresponds to at least one NVM cell in memory array 110. ANN 140 includes an input layer 141, one or more hidden layers 142, and an output layer 143. Input values are presented to input layer 141 for propagation and processing through one or more hidden layers 142, and final presentation as output values by output layer 143. The propagation and processing operations can be referred to as inference operations, which typically occur after a training process establishes synaptic weights to be stored by artificial neurons of each layer.

Layers, as used herein, refers to any collection or set of nodes which share a similar data propagation phase or stage in an ANN interconnection scheme. For example, nodes of a layer typically share similar connection properties with regard to preceding layers and subsequent layers. However, layering in an ANN, in certain embodiments, may be a logical organization of nodes of the ANN which layers can differ depending upon the ANN topology, size, and implementation. Input layers comprise a first layer of an artificial neural network which receives input data, input values, or input vectors for introduction to the ANN. Typically, an input layer will have a quantity of input nodes which correspond to a size or length of an input value/vector. These input nodes will then be connected to a subsequent layer according to a connection style, such as fully connected or partially connected, and the like. Layers placed between an input layer and an output layer are referred to as intermediate layers or 'hidden' layers. Hidden layers and hidden nodes are referred to as 'hidden' because they are hidden, or not directly accessible for input or output, from external systems. Various interconnection styles can be employed for nodes in hidden layers as well, such as fully connected or partially connected. Finally, an output layer comprises a final layer, or last layer, of nodes of the ANN which receives values from a last hidden layer or a last intermediate layer and presents these values as outputs from the ANN. The quantity of nodes in the output layer typically correspond to a size or length of an output value. These output values are commonly referred to as logits or logit vectors, and relate to a prediction made by the ANN after inference processes have propagated through the various hidden layers. The logit vectors can be further processed in an additional layer, referred to commonly as a softmax layer, which scales the logit vectors according to a predetermined output scale, such as a probability scale from 0 to 1, among others.

In operation, neural network inference comprises using a trained neural network to determine predictions based on input data. Inference operations might involve multiplying a weight matrix with an input matrix. For example, control circuitry 130 can fetch a weight matrix from memory 131 for storage into memory array 110. Input data is then introduced at input layer 141 and propagates through hidden layers that store representations of the weight matrix before an output value is presented at output layer 143. Output layer 143 can pass this output value to an optional softmax process or softmax layer which normalizes the output value before transfer to an external system as a prediction result. In another matrix multiplication example, a 3×3 pixel slice of an input image is convoluted with a 3×3 filter. When used in a CNN inference operation, this convolution can involve a 3×3 input matrix being multiplied by a 3×3 weighted filter. In the examples herein, such matrix multiplication can be performed in-memory using NVM cells. First, multi-bit numbers can be multiplied using gate terminal voltage ramping techniques. Then, combinations of results can then be used to determine an activation matrix multiplied by a weighted filter matrix.

Figure 2:
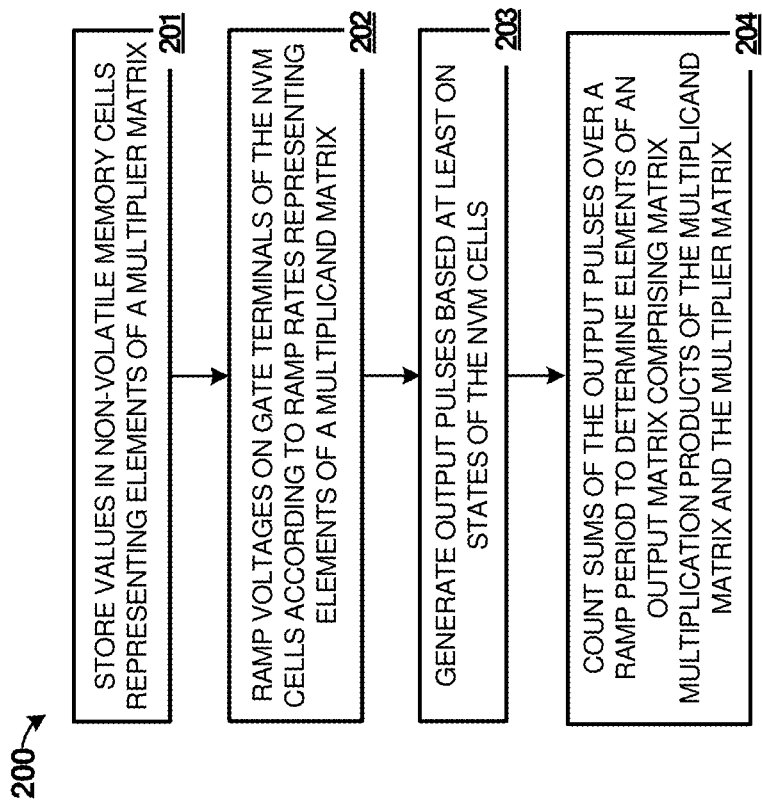
FIG. 2 illustrates an operation of an in-memory multiplication system in an implementation.

Turning now to an additional discussion on the operation of elements of FIG. 1, FIG. 2 is presented. FIG. 2 is flow diagram 200 illustrating a method of operating in-memory multiplication in an artificial neural network. In FIG. 2, operations are related to elements of FIG. 1. However, the operations of FIG. 2 can apply to any of the implementations discussed herein, among others. Additionally, although the terminology of matrix multiplication is employed herein for clarity, it should be understood that non-matrix multiplication or other multiplication types might instead be employed.

In FIG. 2, both multiplicand and multiplier matrices are discussed. These matrices comprise arrays of one or more elements or entries arranged into row-by-column representations. Although the matrices might comprise any numerical elements, the examples herein focus on the context of artificial neural networks. In these contexts, a multiplicand might correspond to input data, such as a portion of an input image to be processed over an artificial neural network using a multiplier matrix. The multiplier matrix can comprise 'weights' for artificial neurons. Data processing properties of artificial neurons can be referred to as weights or synaptic weights. Synaptic weights indicate a strength or amplitude of a connection among two artificial neurons. This can correspond to an amount of influence that a first artificial neuron has on another artificial neuron.

Turning now to the operations of FIG. 2, control circuitry 130 stores (201) values in non-volatile memory cells representing elements of a multiplier matrix. Control circuitry 130 can retrieve elements of a multiplier matrix from memory 131, or receive the elements of the multiplier matrix over link 160 from an external system. Control circuitry 130 then determines values to store within NVM cells of memory array 110 which represent the elements of the multiplier matrix. Depending upon a ramp directionality or polarity discussed in operation 202, as well as the storage technology or NVM cell type and other considerations, actual numerical values from the multiplier matrix might not be stored with in NVM cells of memory array 110. Instead, representations or encodings of the elements of the multiplier matrix can be stored into NVM cells of memory array 110. Once the representations are determined, control circuitry 130 can perform one or more write operations to store the representations of the elements of the multiplier matrix, such as by interfacing with interface circuitry 120 over control links 161-162, and interface circuitry 120 responsively controls memory array 110 over selected input control lines 153 and output control lines 164.

Figure 3:
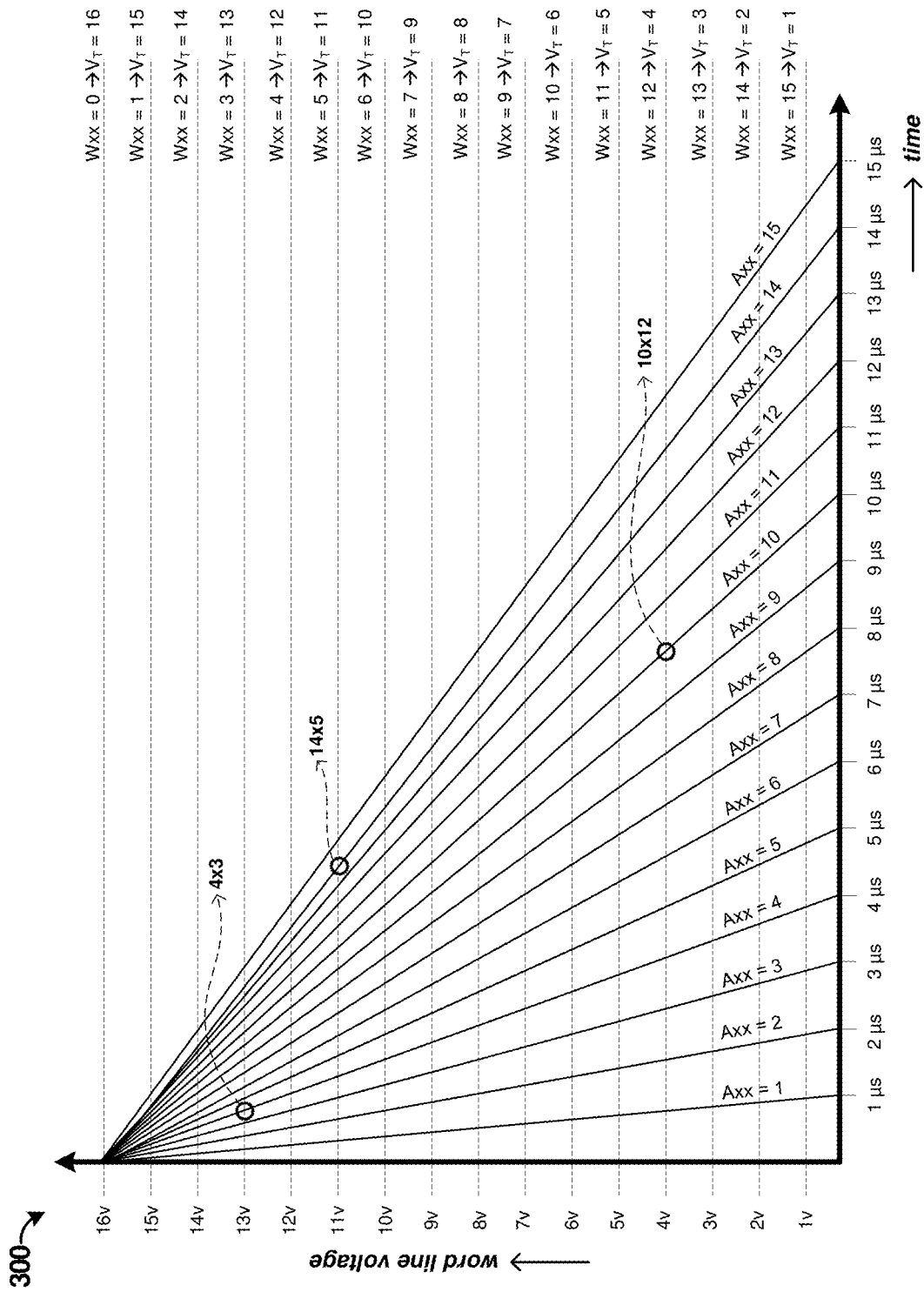
FIG. 3 illustrates ramping values for an in-memory multiplication system in an implementation.
Figure 4:
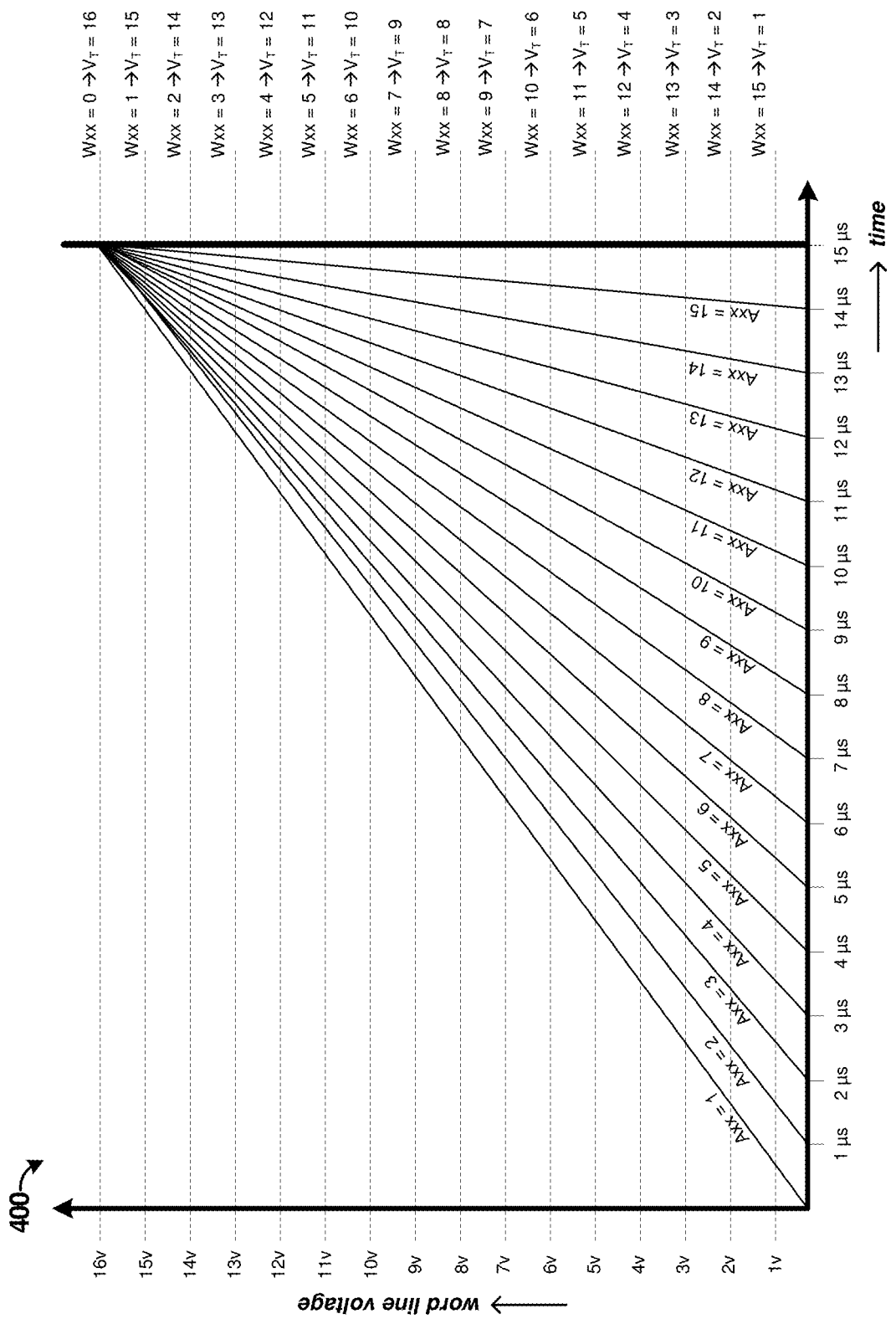
FIG. 4 illustrates example circuitry to ramp voltages in an implementation.

FIGS. 3 and 4 illustrate example representations for elements of a multiplier matrix stored as threshold voltage properties of NVM cells. In FIGS. 3 and 4, graphs 300 and 400 each present a vertical scale indicating example weight values stored into an NVM cell. This scale is indicated on the right-hand side of the graph and shows sixteen (16) weighting $W_{xx}$ values which can vary from 0 to 15. Weighting values are referred to herein as $W_{xx}$ values. When in a matrix formulation, weighting values can instead be represented with $W_{ij}$ notations. Each $W_{xx}$ value is represented by a particular threshold voltage ($V_T$). Thus, in this example, the $V_T$ values correspond to 16–$W_{xx}$. The value of sixteen is selected based upon various factors, but primarily upon the range of whole values that for a quantity of bits that can be stored per-cell in the NVM cell (e.g. 4 bits per cell that can represent values between 0 and 16).

In one embodiment, a quad level cell (QLC) based NOR flash memory might be employed in an example circuit, which can store four bits per cell. These four bits per cell can correspond to 16 different logical levels on a per-cell basis. Although any voltage range and increment for $V_T$ might be selected, for ease of illustration graphs 300 and 400 indicate $V_T$ values of 1 to 16 with an increment or granularity of 1 volt. Smaller granularities can correspond to more difficulty in resolving output states of an NVM cell, while larger increments might limit the quantity of $V_T$ levels for a given voltage range. The voltage range is typically selected based on the programming voltage ($V_{PP}$) for the particular memory cell technology. For the implementation in FIG. 3, a $V_{PP}$ is 16V.

Control circuitry 130 ramps (202) voltages on gate terminals of NVM cells according to ramp rates representing elements of a multiplicand matrix. A ramp rate is a measure of a change in voltage on the gate terminal of the NVM cell per unit of time. In certain embodiments, the ramp rate is measured in units of volts (V) per microsecond (µs). In various embodiments, the voltage of the ramp rate may descend from an initial voltage to a lower final voltage or rise from an initial voltage to a higher final voltage. Typically, the change in ramp rate (also known as "ramping") comprises a linear ramp between the initial voltage and final voltage, although variations are possible.

Figure 10:
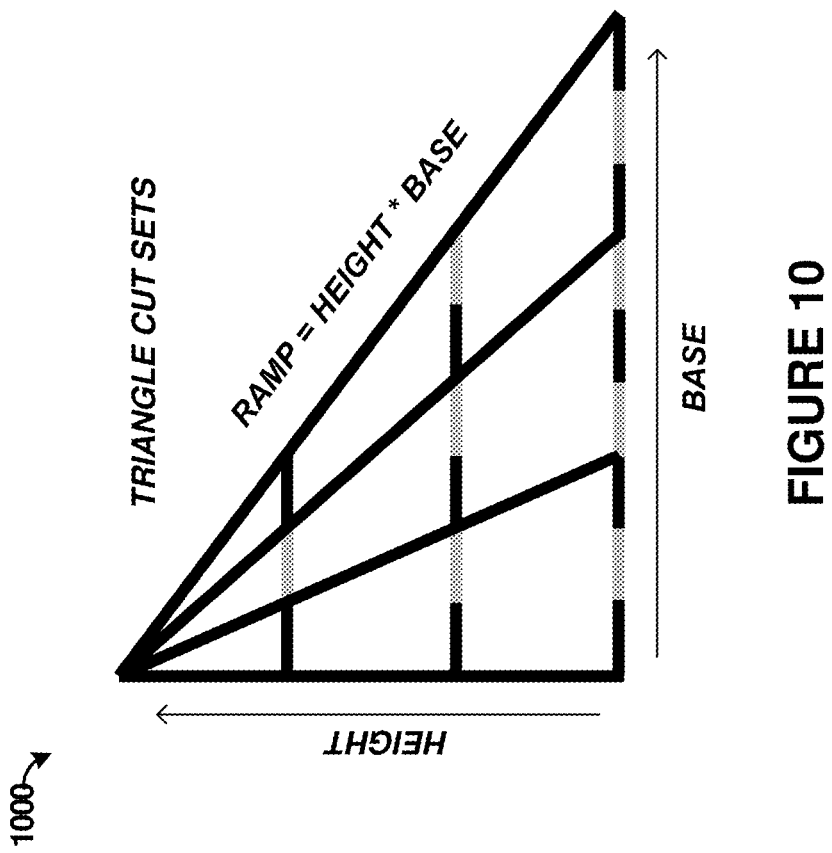
FIG. 10 illustrates example trigonometric multiplication techniques.

When linear ramp rates are employed, the ramp rates may be determined trigonometrically. One example multiplication approach can be trigonometric, which is illustrated in FIG. 10. Consider right-angle triangle 1000 that is divided into equal segments along its height, and sliced at different angles. The base of the resulting triangle has a width of (base width)=(height*(1/ramp)).

In the examples herein, multiplication can be performed in-memory using NVM cells using these trigonometric techniques. An NVM cell can have a threshold voltage set to a value representing a multiplier, which corresponds to a value of a height segment in FIG. 10. A multiplicand is represented by a ramp rate for a voltage applied to a gate terminal of the NVM cell, which corresponds to a slope of the ramp or hypotenuse in FIG. 10. This slope is referred to herein as a ramp rate. When a single NVM cell is employed, then a single multiplication product corresponds to a multiplicand represented by a voltage ramp rate applied to a gate terminal of the NVM cell multiplied by a multiplier represented as a threshold voltage level set for the NVM cell. The multiplication product is indicated by a state of the NVM cell during the voltage ramp, which corresponds to a value of a base segment in FIG. 10.

In further examples, multi-bit numbers can be multiplied using many concurrent NVM cells using these gate terminal voltage ramping techniques. Combinations of these multi-bit numbers can also be used to determine matrix multiplication products. For example, when employed in an artificial neural network context, an activation matrix can be multiplied by a weighted filter matrix.

FIGS. 3 and 4 illustrate example ramp rates in various implementations. In FIG. 3, graph 300 presents a vertical axis representing voltage applied to a gate terminal of an NVM cell, such as over a corresponding word line. Graph 300 also includes a horizontal axis representing time. Various voltage ramps are shown in graph 300 which begin at an initial 'high' voltage and ramp down to a final 'low' voltage. FIG. 4 illustrates graph 400 with various voltage ramps which begin at an initial 'low' voltage and ramp up to a final 'high' voltage. The high and low voltage levels can vary depending upon implementation. In FIGS. 3 and 4 the high voltages correspond to 16 volts (V), which corresponds to a program voltage of corresponding NVM cells, while the low voltages correspond to 0V or a reference voltage. Also, as can be seen in FIGS. 3 and 4, each voltage ramp corresponds to a different duration in time, from 0-15 microseconds (µs). A maximum voltage ramp time is shown as 15 µs. Although a 1 µs granularity has been selected for this example, different ramp time durations and granularities can instead be employed. Moreover, the granularity typically corresponds to a clock cycle, such as 1 µs in this example. It should be understood that this time granularity can also vary according to implementation. FIGS. 3 and 4 might indicate predetermined or precalculated ramp rates established as corresponding to a range of numerical values possible for multiplicand elements scaled according to a time granularity of the ramp period. However, ramp rates might be calculated as-needed, and not predetermined.

In graph 300, fifteen (15) downward voltage ramps are presented, with each voltage ramp corresponding to a particular value of $A_{xx}$. $A_{xx}$, as used herein, corresponds to a value of an element from a multiplicand matrix or input matrix. For example, if an element has a value of '1', then this value would correspond to the ramp presented for $A_{xx}$=1. Values of 1 to 15 are represented in graph 300 by different ramp rates that correspond to a voltage starting at 16V and ramping down to 0V at a rate indicated in graph 300. A multiplicand value of zero (0) is not represented in graph 300, and instead is a boundary condition that would produce a vertical ramp or zero-time ramp. The ramp rates thus are established as an inverse of $A_{XX}$, namely, ramp=1/$A_{XX}$ in FIG. 3. Different ramp proportions or ramp scales might be employed than "ramp=1/$A_{XX}$" in FIG. 3.

Figure 6:
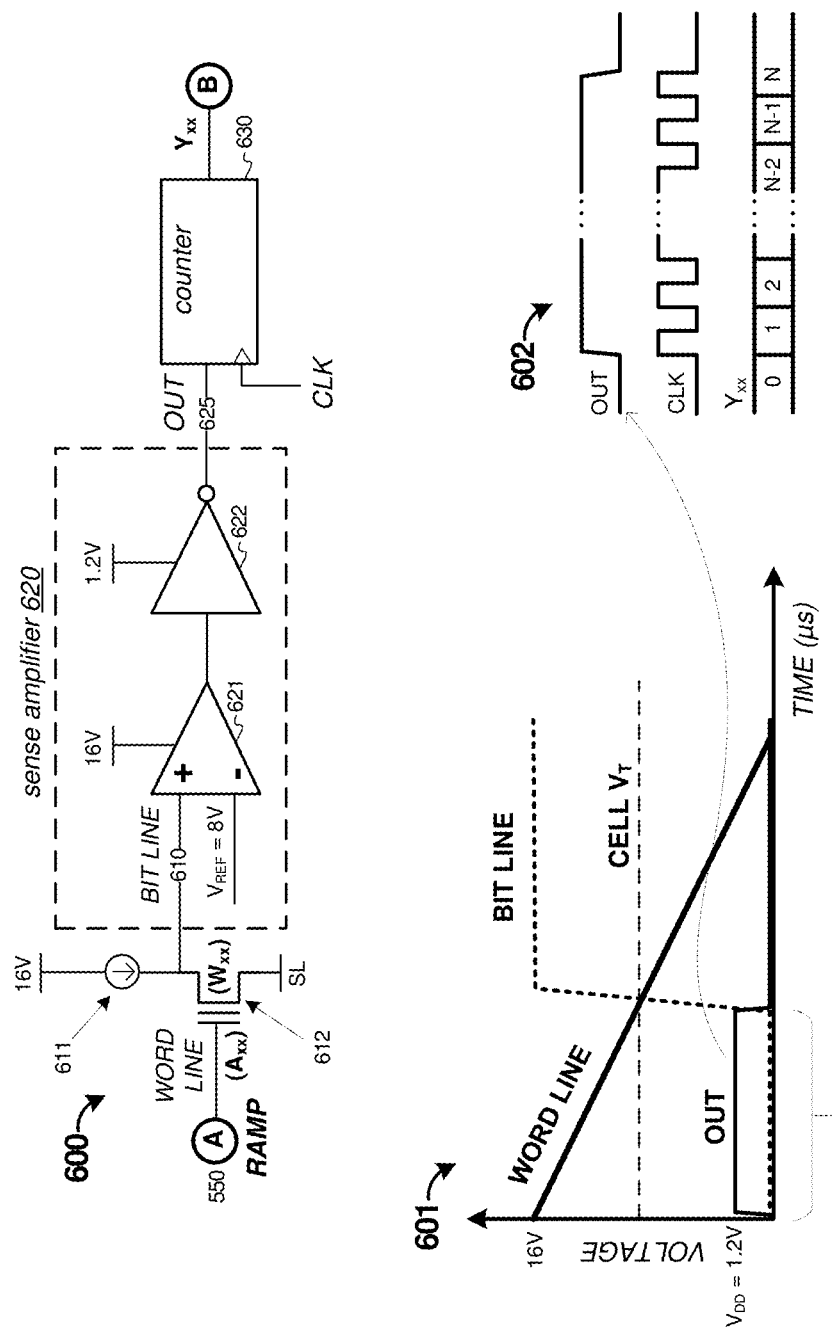
FIG. 6 illustrates example circuitry to perform in-memory multiplication in an implementation.

In graph 400, fifteen (15) upward voltage ramps are presented, with each voltage ramp corresponding to a particular value of $A_{XX}$. Values of 1 to 15 are represented in graph 400 by different ramp rates that correspond to a voltage starting at 0V and ramping up to 16V at a rate indicate in graph 400. A multiplicand value of zero (0) is not represented in graph 400, and instead is a boundary condition that would produce a vertical ramp or zero-time ramp. The ramp rates thus are established as "ramp=1*$A_{XX}$" in FIG. 4. Various logic might be employed when either upward or downward ramps are employed to ensure desired polarity for associated output signals. FIG. 6 details example output circuitry. Different ramp proportions or ramp scales might be employed than "ramp=1*$A_{XX}$" in FIG. 4.

To summarize this enhanced operation, the techniques discussed herein apply input signals which are represented by voltage ramps applied to a circuit. This circuit comprises the NVM cells mentioned in memory array 110 of FIG. 1, but also includes corresponding electrical nodes, such gate terminals or word lines, over which the voltage ramp is applied. The electrical nodes might comprise a word line (WL) when many NVM cells are coupled in an array having columns and rows accessible via word lines and bit lines. As mentioned in FIGS. 3 and 4, various voltage and time granularities can be established for the voltage ramps. FIGS. 3 and 4 illustrate example implementations having sixteen (16) different ramping rates (with a 'zero' ramp rate indicated by an instantaneous ramp). Each of the ramp rates corresponds to a different value of an input signal, such as an input matrix or multiplicand matrix. Thus, 16 different input signal levels are considered in this example. Variations in ramp rate among the 16 different input values can be referred to as ramp modulation, where ramp rates vary according to the input value.

Thus, an input circuit, such as control circuitry 130 or interface circuitry 120, inputs the voltage ramps that represent multiplicand values or multiplicand matrix elements to gate terminals of associated NVM cells. In this example, the input circuit is configured to ramp the voltage from a program voltage (i.e. 16V) of the NVM cells downward to a reference voltage of the circuit. The ramp rate corresponds to an inverse of the input value scaled by a ramp time granularity. As discussed above, these NVM cells previously had threshold voltages set by control circuitry 130 based on representations of multiplier values or multiplier matrix elements. In response to the voltage ramps, the NVM cells individually change state based on their threshold voltages. During the voltage ramps, a time during which a particular NVM cell is in an ON state corresponds to when a voltage applied on a gate terminal via the voltage ramp is greater than the threshold voltage currently set for the NVM cell.

The ON states of the NVM cells are effectively multiplication products of the input signals (voltage ramps) and filter weights stored as threshold voltages. Referring back to FIG. 3, graph 300 shows a relationship between voltage ramp rates on word lines (WL) and NVM cell ON times, among different cell voltage thresholds ($V_T$). For each [1-16] value of $V_T$ stored in the cell, an ON time corresponds to a duration of when the WL voltage is greater than $V_T$. As mentioned above, each voltage ramp rate in graph 300 corresponds to a particular input signal '$A_{xx}$', which indicates a value of 1 to 15 in this example. A multiplication table can be formed by intersections among $A_{xx}$ and $W_{xx}$ values. The $A_{xx}$ values are represented by a WL voltage ramp rate, and the $W_{xx}$ values are represented by bit values stored in the QLC NOR cell.

Example multiplication products can be seen in FIG. 3, which correspond to an ON time resultant from a particular pair of values for the WL voltage ramp rate and $V_T$. For example, an $A_{XX}$ of 4 indicated by the ramp rate shown for $A_{xx}$=4 is multiplied by a $W_{xx}$ value of 3 to create a product of 4×3=7. An $A_{xx}$ of 14 indicated by the ramp rate shown for $A_{xx}$=14 is multiplied by a $W_{xx}$ value of 5 to create a product of 14×5=70. An $A_{xx}$ of 10 indicated by the ramp rate shown for $A_{xx}$=10 is multiplied by a $W_{XX}$ value of 12 to create a product of 10×12=120. In a further example, since the present example uses QLC NOR flash cells having 16 different values established by 4 storage bits in each QLC NOR cell, multiplication of 4-bit numbers can be achieved. For example, to multiply two 4-bit vector numbers, namely an input signal A[3:0] multiplied by a weight W[3:0], the QLC NOR cell $V_T$ is programmed to $V_T$=16-W[3:0], and the WL ramp rate is adjusted to ramp=1/A[3:0]. The time during which the cell is ON (when WL voltage>$V_T$) is therefore: $T_{ON}$=W[3:0] *(1/Ramp)=W[3:0] *A[3:0].

To further elaborate on the multiplication result based on the ramp rate and threshold voltage, a WL voltage is determined as a maximum voltage (16 volts) divided into a predetermined quantity of subsets. Each subset is assigned to a particular input value representing multiplicand values, with input values o f'0' disfavored in this example, as the WL voltage is also 0 when the input value is 0. An NVM cell threshold voltage ($V_T$) is also selected to be a voltage level from 16 to 0. Each level of $V_T$ is assigned to a particular weighting value. To determine a duration 't' when the WL voltage satisfies a $V_T$, a mathematical relation indicates that 't'=(1⁄16)*$A_{xx}$*$W_{xx}$. Thus, 't' represents a multiplication result based on a product of $A_{xx}$*$W_{xx}$ and corresponds to a duration ($T_{ON}$) when a WL voltage satisfies $V_T$ for a cell. A result, indicated by $Y_{xx}$, can correspond to 16*$T_{ON}$.

Control circuitry 130 generates (203) output pulses based at least on detected states of the NVM cells. The output pulses indicate a state of the NVM cells, such as when each of the NVM cells are in an ON state. Specifically, responsive to control voltages (referred to herein as gate voltages or WL voltages) satisfying threshold voltages of the NVM cells encoding the stored values (e.g. $V_T$), the NVM cells each are configured to operate in an active state coupling a corresponding bit line to a reference potential. Likewise, responsive to the control voltages not satisfying the threshold voltages, the NVM cells each are configured to operate in an inactive state decoupling the corresponding bit line from the reference potential. The output pulses have durations that correspond to the multiplication result, or the value 't' discussed above. The pulses can be generated as a sensed, buffered, level-shifted, or otherwise conditioned version of an output presented by each NVM cell. Moreover, logical inverters might be included to change a polarity of the output of each NVM cell to a desired pulse polarity. FIG. 6 illustrates an example output circuit.

When a single multiplicand and multiplier are multiplied together, then a duration of the corresponding output pulse indicates the multiplication product. However, the examples herein also can relate to bit vector or matrix multiplication. Further circuitry and processing can be included to determine multiplication products in these examples. For instance, when many NVM cells are employed to multiply matrices with each other, then control circuitry 130 can add corresponding subsets of output pulses using adder circuitry to determine a composite multiplication result. This composite multiplication result can be used to determine an element in an output matrix. Control circuitry 130 can determine, over a maximum ramp period, how many output pulses are active at any given time. The maximum ramp period can be based on the ramp rates seen in FIGS. 3 and 4, such as 15 μs, among other implementations. A ramp granularity can be employed to determine a sum of the output pulses during a particular granular timeframe. This timeframe can correspond to a clock period, or other granular timeframe. Furthermore, control circuitry 130 counts (204) these sums of the output pulses over the maximum ramp period to determine elements of an output matrix comprising matrix multiplication products of the multiplicand matrix and the multiplier matrix. A more detailed discussion on this operation is found in FIG. 7 below.

Figure 5:
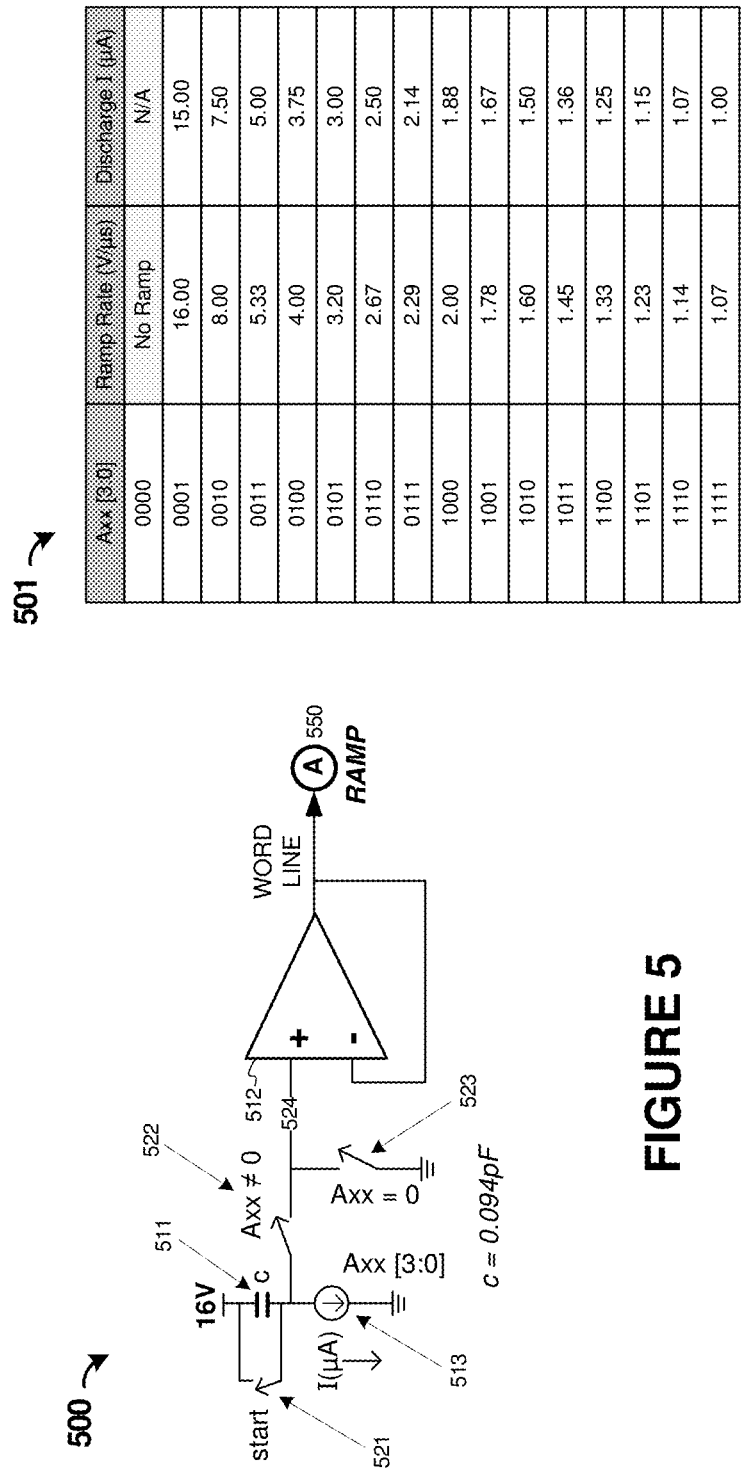
FIG. 5 illustrates ramping values for an in-memory multiplication system in an implementation.

FIG. 5 details an example implementation of ramp circuitry, shown as circuitry 500. Circuitry 500 includes capacitor 511, voltage follower 512, and current source 513. Capacitor 511 is provided by one or more capacitance elements, and is coupled to a ramp voltage source of 16V in this example. The value of 16V corresponds to a $V_{pp}$ of an NVM cell driven by circuitry 500, although other values can be employed. Capacitor 511 is positioned between the ramp voltage source and an electrical node shared with current source 513 and a positive input terminal of voltage follower 512.

Voltage follower 512 might comprise an operational amplifier, transistor, or other circuit element, that buffers or scales a voltage level of an input signal at the positive terminal to present an output signal that mimics the input signal. This voltage follower 512 might be employed to alter an output impedance of circuit 500, and may be omitted in some examples. A negative terminal of voltage follower 512 is coupled to ramp output 550 at node 'A'. Current source 513 is schematically illustrated in circuitry 500, but might comprise elements such as a transistors, resistors, or operational amplifiers, to draw a steady current that discharges through capacitor 511.

Current source 513 in conjunction with capacitor 511 produces a ramped voltage that depends in part on the capacitance of capacitor 511 and the discharge rate of capacitor 511 provided by current source 513. Specifically, to provide a ramped word line (WL) voltage (V) over time (t) of $WL(V) = 16 - (16/A_{XX})*t$, then a $ramp = dWL(V)/dt = -16(v/\mu s)/A_{XX} = -1.6E+7 (v/s)/A_{XX}$. Using particular circuit values from circuitry 500, the $ramp = dV/dT = I/C = (1.6E+7)/A_{XX}$, where capacitance (C) = 0.094 picofarads (pF), and where current $(I) = C*Ramp = (0.94E-13)*(1.6E+7)/A_{XX}$. Thus, the $ramp = 1.5E-6/A_{XX} = 1.5$ μA/$A_{XX}$.

Table 501 illustrates example ramp rates based on $A_{XX}$ input values for the aforementioned sixteen levels of $V_T$ provided by a QLC NOR cell. For a specific implementation, discharge currents $A_{XX}[3:0]$ provided by current source 512 are shown based on capacitance C = 0.094 picofarads (pF), which can produce a maximum ramp rate over a 15 μs time period shown in FIGS. 3 and 4. In table 501, a first column includes values for $A_{XX}$ represented by 4-bit values which vary from 0 represented by [0000] to 16 represented by [1111]. Ramp rates are shown in the second column of table 501, from a maximum ramp rate of 16.00 volts per μs (V/μs) when $A_{XX}$ is [0000] to a minimum ramp rate of 1.07 V/μs when $A_{XX}$ is [1111]. A 'no ramp' value boundary condition indicated in table 501 when $A_{XX}$ is [0000], indicating an undefined ramp rate. This boundary condition is implemented in circuit 500 as switch elements 522 and 523. When $A_{XX}$ is [0000], then switch element 522 is opened and switch element 523 is coupled to a ground potential. This pulls the positive terminal of voltage follower 512 to ground to hold ramp output 550 at node 'A' to the ground potential. Conversely, when $A_{XX}$ is not [0000], then switch element 523 is opened and switch element 522 is closed to couple the ramping capacitance/current to the positive terminal of voltage follower 512.

In operation, circuit 500 controls a ramp rate of voltages applied to a word line for an NVM cell. Current source 513 sinks a variable current to the ground potential, and is configured with a value for $A_{XX}[3:0]$, such as a 4-bit value from 1-16. As mentioned above, a value of [0000] for $A_{XX}$ would not be allowed in this example, as shown by two switching elements 522 and 523 configured to close if $A_{XX} \neq 0$ or $A_{XX} = 0$, respectively. Capacitor 511 in series with the source voltage of 16V and provides a ramp rate for a voltage at electrical node 524 when current source 513 is configured with a value for $A_{XX}$ and ramp start condition 521 is initiated. The capacitance value of capacitor 511 can be tuned to suit a desired maximum ramp rate in microseconds (μs), such as 0.094 picofarads in this example. Voltage follower circuit 512 is coupled to electrical node 524 and isolates the current/voltage source from an output of the ramp control circuit. The output of the ramp control circuit is a voltage that changes in time according to the ramp rate selected by a value for $A_{XX}$ and the capacitance value.

Figure 7:
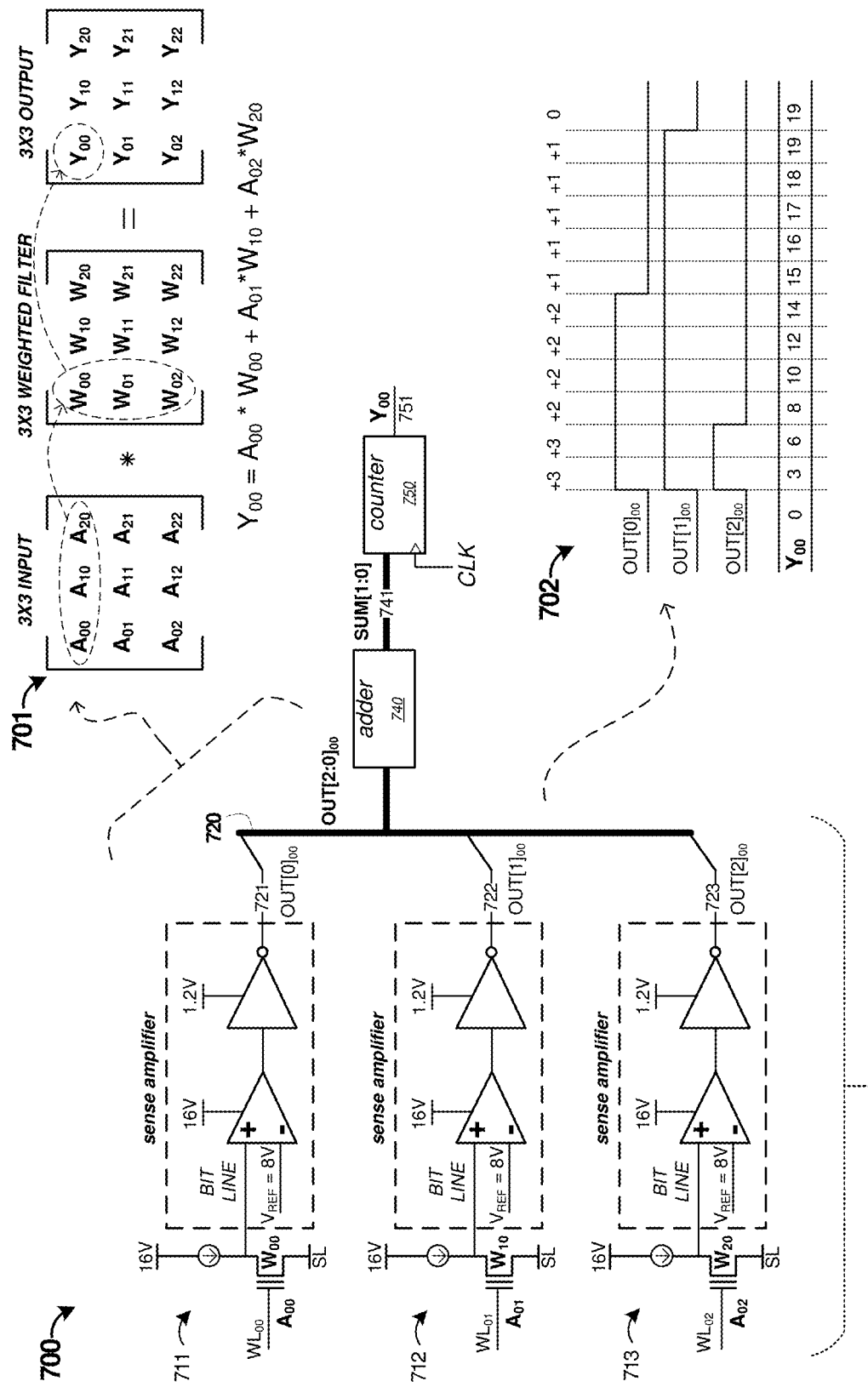
FIG. 7 illustrates example circuitry to perform in-memory matrix multiplication in an implementation.

FIG. 6 illustrates an example implementation of output circuitry comprising sense circuitry coupled to an associated NVM cell. FIG. 6 includes circuitry 600 as well as output waveform graph 601 and output timing diagram 602. Sense circuitry comprises sense amplifier 602, and optionally counter 630. The elements of FIG. 6 determine a single multiplication product $Y_{XX}$ for a multiplicand of $A_{XX}$ and multiplier of $W_{XX}$. An input to circuitry 600 is provided by a ramp circuit, such as shown in FIG. 5 for circuitry 500 which produces ramp output 550 at node 'A'. Thus, when circuitry 500 is coupled to circuitry 600, a single value multiplication circuit is established. Various combinations of these multiplication circuits, along with other circuitry, can establish matrix multiplication as shown in FIG. 7 below.

Turning now to FIG. 6, circuitry 600 includes NVM cell 612, current source 611, input node 'A', output node 610, sense amplifier 620, counter 630, and multiplication result node 'B'. NVM cell 612 might comprise any three-terminal non-volatile memory technology discussed herein, but in FIG. 6 NVM cell 612 comprises a QLC flash NOR cell. As discussed herein, a QLC NOR cell can store four bits per cell, typically relating to $2^4 = 16$ data levels or $V_T$ levels. Current source 611 is coupled between a voltage source of 16V and a drain terminal of NVM cell 612. NVM cell 612 is coupled at a drain terminal to bit line (BL) 610, coupled at a source terminal to a source line (SL), and coupled at a gate terminal to a word line (WL). In operation, NVM cell 612 stores values representing $W_{XX}$ as threshold voltages ($V_T$), and the WL receives voltage ramps representing $A_{XX}$ values. The BL of NVM cell 612 presents a state of NVM cell 612 responsive to the voltage ramps, and SL is coupled to a reference potential, such as a ground potential.

Once a voltage ramp circuit has been established, as in FIG. 5, this voltage ramp circuit can feed NVM cell 612 which is further coupled to sense amplifier 620. The circuit in FIG. 6 represents one example circuit and can be referred to here as a multiplication circuit. Voltage ramps are applied to the WL node in FIG. 6, while NVM cell 612 is coupled between a programming voltage ($V_{PP}$) of 16V and ground at a select line (SL). The current source in FIG. 6 might comprise a resistor in some examples, among other circuit elements to tie NVM cell 612 to $V_{pp}$ or other voltages. Current source 611 can comprise a suitable resistance value or other current limiting element selected based on a desired current level to flow through NVM cell 612 when active.

Sense amplifier 620 comprises comparator 621 coupled to a source voltage of 16V, similar to the source voltage of NVM cell 612. A negative terminal or reference terminal of comparator 621 is coupled to a reference voltage, namely 8V. Bit line (BL) 610 is coupled to a positive terminal or sense terminal of comparator 621 in sense amplifier 620. BL 610 triggers the comparator to change output state when the BL node exceeds the reference voltage of 8V. Specifically, the reference voltage is compared to the input voltage presented on bitline 610 coupled to the sense terminal of comparator 621. When bitline 610 exceeds the reference voltage, then comparator 621 outputs a positive value, and when bitline does not exceed the reference voltage, then comparator outputs a reference voltage as zero volts. Sense amplifier 620 also includes inverter 622. Inverter 622 follows comparator 621 to shift the voltage level on an output of comparator 621 to a selected level, such as a logic level. In this example, the logic level is 1.2V, but other logic levels can be used. Inverter 622 receives the output from comparator 621 and also inverts the signal while converting the output voltage level of comparator 621 into a desired logic level. Inverter 622 might be omitted when different comparator output voltage levels or output polarities are employed, such as when rising ramps are employed as seen in FIG. 4. It should be understood that other source voltage levels, logic levels, and polarities of the various circuitry in FIG. 6 can be employed.

To read out a multiplication product from a particular memory cell represented by NVM cell 612 in FIG. 6, an enhanced sense amplifier 620 can be employed. Sense amplifier 620 generates a voltage pulse while the memory cell is ON during application of the voltage ramp. The width or duration of this voltage pulse ($T_{ON}$) is equal to the multiplication product of a multiplicand A[3:0] and multiplier W[3:0]. To further elaborate, the width of this voltage pulse is related to a state of the corresponding NVM cell during a voltage ramp on a gate terminal of the NVM cell. A correspondence between the state of the NVM cell and a multiplication product arises due in part to the ramp rate having a particular ramp duration. $T_{ON}$ indicates when the word line voltage exceeds a $V_T$ representing $W_{XX}$, and for descending voltage ramps, a mathematical relation indicates that $T_{ON}=(1/16)*A_{XX}*W_{XX}$. Thus, $T_{ON}$ represents a multiplication result based on a product of $A_{XX}*W_{XX}$, and corresponds to a duration ($T_{ON}$) when the word line voltage is greater than $V_T$ for NVM cell 612. The result $Y_{XX}$ can correspond to $16*T_{ON}$. In FIG. 6, counter 630 determines $16*T_{ON}$.

As can be seen in FIG. 6, a program voltage (e.g. $V_{pp}$) for the memory cell is 16V. Other voltages might be employed which are based in part on the particular program voltage for the memory cell. Associated ramp rates, 'A', and associated weight values, 'W', might be scaled in accordance with the particular V, program voltage. In this example, sense amplifier 620 detects the $T_{ON}$ condition compared to a reference voltage ($V_{REF}$), and outputs a voltage pulse at a desired logic level, such as 1.2V in FIG. 6. As the word line (WL) voltage ramps downward in voltage level at a designated ramp rate from 16V to 0V, $T_{ON}$ corresponds in this example to a time over which the memory cell is ON, corresponding to bit line (BL) pulled to a low voltage state. When the WL voltage drops below the cell memory value ($V_T$), then the BL is pulled to a high voltage state and the voltage pulse output responsively transitions to a logic low level. The width of the voltage pulse in a logic high state ($T_{ON}$) corresponds to the desired multiplication product. Since a time granularity of the voltage ramp on the WL=1 µs, then $T_{ON}=A_{XX}*W_{XX}*(1 µs/16)$.

As a further operational description of circuitry 600, graph 601 and timing diagram 602 are presented showing example values for various voltages. Graph 601 illustrates relationships among a word line input, cell $V_T$, bit line output of the NVM cell, and output (OUT) from sense amplifier 620. The word line curve in graph 601 represents a voltage present on electrical node 'A' in FIG. 6, which might be produced by a ramp circuit as found in FIG. 5, among other implementations. The ramp rate of the word line curve represents a value of $A_{XX}$. The cell $V_T$ curve in graph 601 represents a value $W_{XX}$ which has been 'stored' by writing a corresponding value into NVM cell 612 to set the threshold voltage. The bit line curve in graph 601 represents a voltage present on electrical node 610, which reflects a state of NVM cell 612. The output (OUT) curve in graph 601 represents a voltage present at the output of sense amplifier 620 at electrical node 625.

The voltage on the output of sense amplifier 620 indicates a multiplication product. This multiplication product is represented by a pulse width $T_{ON}$ at node 625. A pulse width conversion might be performed to determine a digital representation of the pulse width. In FIG. 6, and example counter circuit is coupled to the output of sense amplifier 620 of FIG. 6. Specifically, sense amplifier 620 is coupled at node 625 to counter 630. Counter 630 comprises circuitry to count durations of an output pulse produced by sense amplifier with regard to a clock signal. In one example, counter 630 of FIG. 6 is clocked by a clock signal which has a clock period of (1 µs/16)=62.5 nanoseconds (ns). Other clock periods can be used, typically based on the granularity of the ramp rates applied to the WL nodes and the maximum pulse duration. During each occurrence of the clock signal, counter 630 checks node 625 for a logic 'high' level. If a logic high is presently on node 625, then counter 630 increments a count. If a logic low is instead presently on node 625, then counter 630 does not increment a count. A reset signal might be provided for counter 630, but is omitted in FIG. 6 for clarity. While the pulse output by sense amplifier 620 comprises an analog version of the multiplication product of $A_{XX}$ and $W_{XX}$, the output produced by counter 630 comprises a digital version.

Timing diagram 620 illustrates an example digital count produced from an analog output pulse. As each pulse output (OUT) is produced, a digital version is determined in terms of clock periods (CLK) compared to the pulse width. This digital version can include a quantity of digital bits sufficient to represent the duration of the output pulse produced by sense amplifier 620. The digital value of $Y_{XX}$ is thus represented as a count from 0-N, where N corresponds to a maximum pulse width. Multiplication product $Y_{XX}$ thus comprises a digital version of the multiplication product of $A_{XX}$ and $W_{XX}$, and is output on node 'B' in FIG. 6. The digital pulse width (PW) of $Y_{XX}=A_{XX}*W_{XX}*62.5$ ns. As will be seen below, the multiplication product can be combined with other multiplication products to calculate matrix multiplication products.

FIG. 7 is now presented to illustrate in-memory matrix multiplication in an implementation. Matrix multiplications typically involve multi-dimensional numbers. Neural network inference operations can involve fetching a weight matrix and multiplying with an input matrix. For example, the matrix multiplication might correspond to an image convolution operation of an artificial neural network. In image convolution examples, a multiplicand matrix comprises an activation matrix for the image convolution operation, and a multiplier matrix comprises a weighted filter for the image convolution operation. In matrix operation 701 of FIG. 7, a 3×3 input matrix, such as a pixel slice of an image, is convoluted with a 3×3 weighted filter matrix to produce a 3×3 output matrix. In the examples herein, such multiplication can be performed in-memory using NVM memory cells.

Circuit 700 is included in FIG. 7, and comprises matrix multiplication circuit 710, adder 740, and counter 750. Matrix multiplication circuit 710 includes three instances of portions of circuitry 600 of FIG. 6. Input values from ramp circuitry are transmitted onto word lines $WL_{00}$, $WL_{01}$, and $WL_{02}$ to corresponding gate terminals of the NVM cells. Individual multiplier circuits 711-713 calculate intermediate multiplication products and generate output pulses having durations corresponding to the intermediate multiplication products, labeled as $OUT[0]_{00}$, $OUT[1]_{00}$, and $OUT[2]_{00}$ in FIG. 7. Multiplier output links 721-722 can be combined into a bus 720 $OUT[2:0]_{00}$ for input to adder 740. Adder 740 comprises adder circuitry configured to add output pulses representing each intermediate multiplication product: $OUT[0]_{00}$, $OUT[1]_{00}$, and $OUT[2]_{00}$. Counter 750 comprises circuitry configured to receive a sum of the intermediate multiplication products SUM[1:0] on link 741. Counter 750 also comprises counter circuitry configured to incrementally count the sum over each of a plurality of clock cycles.

In operation, circuit 700 shown in FIG. 7 calculates a sum of three (3) multiplication products to construct one output matrix entry or element. When all of the nine (9) elements of the output matrix are calculated, then the three multiplication products comprise a subset of a total quantity of intermediate multiplication products. Each multiplication product can be an output of individual multiplication circuits 711-713, which represent individual instances of portions of multiplication circuit 600 discussed in FIG. 6. Several of such multiplication circuits are configured to operate concurrently, and an even further quantity of multiplication circuits might be employed to calculate other elements of the output matrix. Each multiplication circuit would have associated WL ramp rates ($A_{XX}$) and stored weights ($W_{XX}$) to produce associated intermediate multiplication outputs ($Y_{XX}$). When dealing with matrices, the discussion herein employs different subscript labels, namely $A_{ij}$, $W_{ij}$, and $Y_{ij}$, to conform with standardized matrix representations.

Adder 740 sums intermediate multiplication products, in the form of voltage pulses, to calculate a single element in an output matrix, namely element $Y_{ij}$. In FIG. 7, three instances of a multiplier circuit are coupled to adder 740 which adds output pulses of the multiplier circuits. A pulse from a multiplier circuit at a logic high level (i.e. 1.2V) increases an output sum by a value of '1' and a pulse at a logic low level (i.e. 0V) does not increase the output sum. Thus, adder output values from 0 to +3 are possible for this configuration of three parallel multiplier circuits. In context of the matrix multiplication of FIG. 7, to determine a first element in the output matrix, $Y_{00}$, a sum of three intermediate multiplication products is calculated ($A_{00}*W_{00}+A_{01}*W_{10}+A_{02}*W_{20}$). Adder 740 can determine a total number of pulses active at any given time, which is indicated in timing diagram 702 along the upper edge. Since three intermediate multiplication products are involved ($OUT[0]_{00}$, $OUT[1]_{00}$, and $OUT[2]_{00}$), a maximum sum of '+3' indicates all three intermediate multiplication products are active, while a minimum sum of '0' indicates no intermediate multiplication products are active.

Counter 750 is coupled to an output of adder 740. Counter 750 is clocked by a clock signal. Counter 750 increments a count based on the sum of active pulses for each of a plurality of clock cycles. Counter 750 generates an updated count based on the output of adder 740 monitored for each clock cycle. An output of counter 750 transmitted on link 751 corresponds to a matrix multiplication operation result, namely $Y_{00}$. After the maximum duration of output pulse, such as 16 clock cycles, a count is produced as an output $Y_{ij}$. In the specific example of FIG. 7, $A_{00}$ is multiplied by $W_{00}$ in the first multiplier circuit to produce output pulse $out[0]_{00}$, $A_{01}$ is multiplied by $W_{01}$ in the second multiplier circuit to produce output pulse $out[1]_{00}$, and $A_{02}$ is multiplied by $W_{02}$ in the third multiplier circuit to produce output pulse $out[2]_{00}$. A result $Y_{00}=19$ is produced by the counter circuit as a sum of the pulse outputs for all three multiplier circuits. This calculation result of $Y_{00}$ can be completed before ramping of the voltages at the associated WLs in many cases.

Advantageously, the three-multiplier array shown in FIG. 7 can be used to concurrently generate a sum of three (3) products. In this example of 3×3 matrices, an output value for each element of the output matrix comprises $Y_{ij}=A_{j0}*W_{0j}+A_{i1}*W_{1j}+A_{i2}*W_{2j}$. A single instance of circuit 700 would calculate a single element among the nine elements in the output matrix. Further matrix multiplication circuitry can be included for the remaining 8 output matrix entries. In other examples, circuit 700 might be time-shared to calculate each of the nine values of the output matrix in succession.

Figure 8:
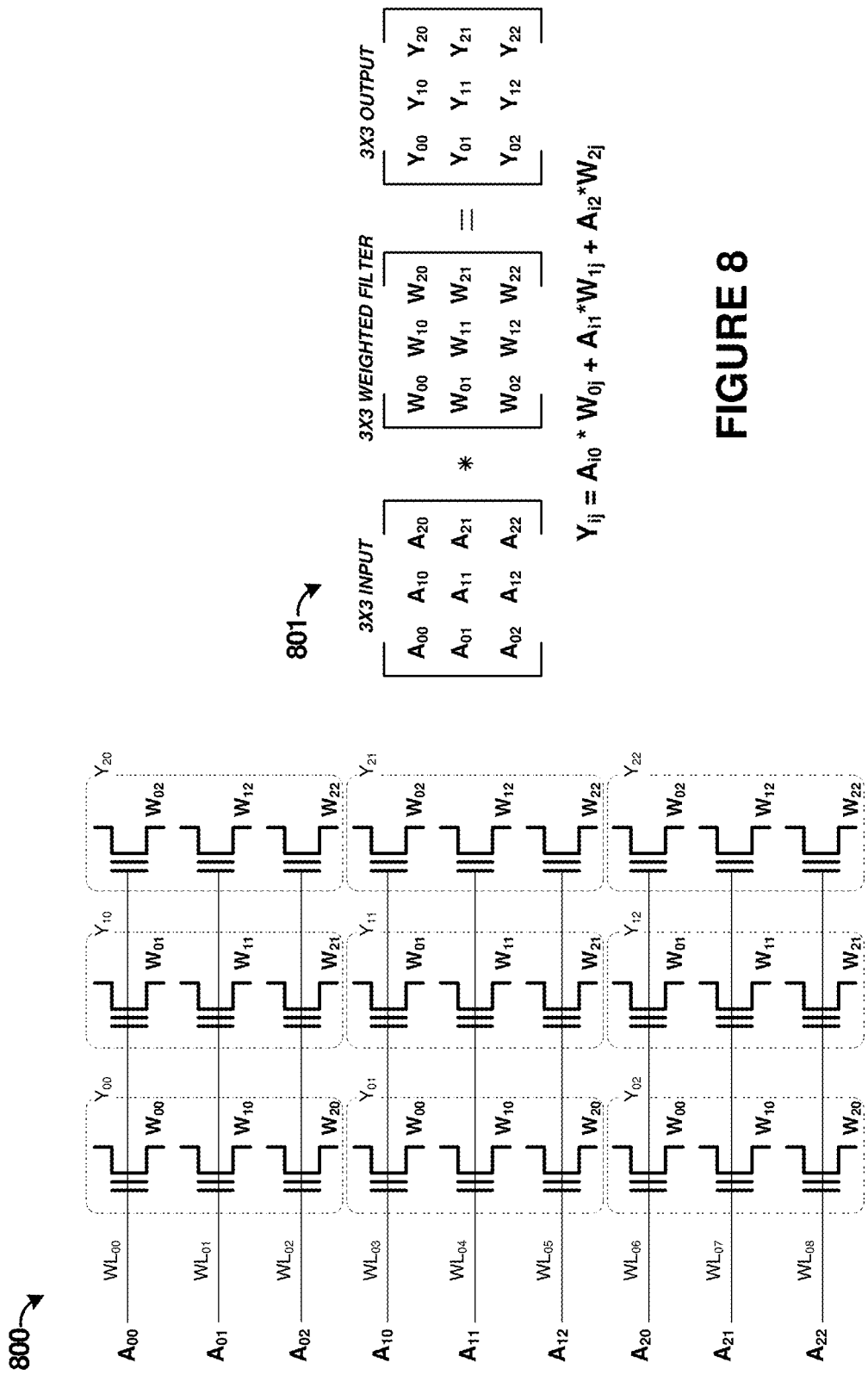
FIG. 8 illustrates example circuitry to perform in-memory matrix multiplication in an implementation.

FIG. 8 is now presented to illustrate an example implementation for a full matrix multiplication circuit. As previously seen in FIG. 7, only a subset of the total 3×3 matrix multiplication calculations are performed using three NVM cells and corresponding peripheral circuitry. Result $Y_{00}$ was obtained in FIG. 7, but further input values for $A_{ij}$ and stored values of $W_{ij}$ are employed to produce further results for $Y_{ij}$. This circuit of FIG. 7 can be further scaled up to compute all nine elements of an output matrix when a 3×3 matrix multiplication is desired. Larger or smaller matrix multiplications can be performed using similar techniques and arrangements.

Circuit 800 circuit might comprise at least a portion of a convolutional neural network (CNN). In CNN examples, a matrix multiplication product or result comprises multiplying an input matrix and a weighted filter matrix, which corresponds to the input matrix convolved by the filter matrix. The input matrix to be multiplied or convolved can comprise a 3×3 input matrix ($A_{00}$-$A_{22}$). In FIG. 8, each of the elements of the 3×3 input matrix correspond to one of the nine word lines ($WL_{00}$-$WL_{08}$). The weighted filter matrix to be multiplied can comprise a 3×3 weighted filter matrix. In FIG. 8, the 3×3 weighted filter matrix is represented in three copies or instances of threshold voltages set over three rows and three columns among the non-volatile memory elements ($W_{00}$-$W_{22}$).

In FIG. 8, non-volatile memory elements comprise QLC NOR flash cells, and are referred to as QLC weight cells. These QLC weight cells are arranged into array 800 having nine rows and three columns. Twenty-seven (27) QLC weight cells are thus employed. Furthermore, since the QLC weight cells are arranged into a NOR configuration, each of the bit lines for each QLC weight cell is accessible independently. Twenty-seven bit lines of the QLC weight cells are coupled to a corresponding twenty-seven sense amplifier circuits, which generate twenty-seven multiplication product output pulses. For the particular 3×3 matrix multiplication involved, subsets of three multiplication product output pulses are transmitted to a single adder. Thus, nine (9) adders are employed, along with nine counters.

FIG. 8 shows array 800 in a configuration that can be used to multiply each input matrix entry with three weight entries from a weighted filter matrix to construct an output matrix. Note that each input data matrix ($A_{00}$-$A_{22}$) is represented by a modulation or ramp on one corresponding word line ($WL_{00}$-$WL_{08}$), and there are three QLC weight cells coupled to each WL. In a 3×3 matrix multiplication, each element in a first matrix multiplies out three elements in a second matrix. It should be noted that all WLs are typically modulated or ramped at the same time and therefore all matrix multiplications are performed concurrently. By the time the WLs complete ramping, the entire output matrix has been calculated. Weights of the weighted filter matrix are stored in each QLC weight cell, which correspond to $V_T$ values. However, each $W_{ij}$ value is represented three times over the circuit arrangement in FIG. 8. Three instances or copies of the weighted filter matrix ($W_{00}$-$W_{22}$) are employed in the array, as can be seen in FIG. 8. Specifically, $A_{00}$-$A_{02}$, $A_{10}$-$A_{12}$, and $A_{20}$-$A_{22}$ each correspond to an instance of $W_{00}$-$W_{22}$ values.

This matrix multiplication scheme may be further expanded to simultaneously multiply out an entire input image with each filter. Consider a 224×224 input image convolved by a 3×3 filter, corresponding to a 3×3 weighted filter matrix. This particular example focuses on a matrix multiplication operation among a 3×3 matrix of $A_{ij}$ values and a 3×3 matrix of $W_{ij}$ values to produce a 3×3 result matrix of $Y_{ij}$ values. As the filter sweeps across the image, each image matrix entry will eventually multiply with each weighted filter matrix entry. Since each input signal modulates one WL and each input signal will need to multiply each of the nine elements in a 3×3 weighted filter matrix, we can use 224×224=50,176 WLs, each connecting to nine QLC filter cells. In doing so a circuit can simultaneously perform 50,176 matrix multiplication operations. Using the circuit configuration of FIG. 8, with appropriate instances of adder and counter circuitry from FIG. 7, an entire matrix multiplication can be performed concurrently.

Advantageously, the examples herein discuss enhanced circuitry, systems, arrangements, and techniques to perform matrix multiplication operations in memory. Specifically, NVM cell word lines are ramped or modulated based on an input signal matrix, and weight values are stored as bits within NVM cells. A ON state of the NVM cell is directly related to a product of the associated input signal and weight value, which is indicated by an output pulse. Various output circuitry, such as sense amplifiers, buffers, adders, and counters can condition and combine individual output pulses and produce a matrix multiplication result. This result is effectively completed by the end of the voltage ramping operation. Although QLC NOR memory cells are discussed herein as example NVM cells, it should be understood that other NVM cell types can be employed. The usefulness of such enhanced devices, circuits, and techniques, provides cost savings by employing a single chip compute-in-memory solution. Moreover, these techniques provide an enhanced performance boost due to a massively parallel matrix multiplication scheme.

Thus, in the examples presented herein, a multiplication circuit is described. The circuit can comprise a non-volatile memory cell coupled to a word line, and an input circuit configured to ramp a voltage applied to the word line at a rate corresponding to an input value. The circuit can also include an output circuit configured to produce an output pulse when the voltage applied to the word line corresponds to a value higher than a stored value in the non-volatile memory cell, where the output pulse has a duration comprising the input value multiplied by the stored value.

Also, in the examples presented herein, a matrix multiplication circuit is described. The matrix multiplication circuit can comprise an array of non-volatile memory cells arranged on associated word lines, where the word lines have ramped voltages applied thereto which represent elements of an input matrix. Bit lines of the non-volatile memory cells can be coupled to sense amplifiers. The sense amplifiers can be configured to produce output pulses responsive to states of corresponding non-volatile memory cells based at least on relative differences between ramped voltages and stored values in the non-volatile memory cells representing elements of a weighting matrix. The sense amplifiers can be coupled in groups to adder circuits each configured to add the output pulses of a corresponding subset of the non-volatile memory cells. Counter circuits can be coupled to each of the adder circuits and configured to count sums produced by each of the adder circuits, where the sums correspond to elements of a resultant matrix corresponding to matrix multiplication products of the input matrix and the weighting matrix.

Figure 9:
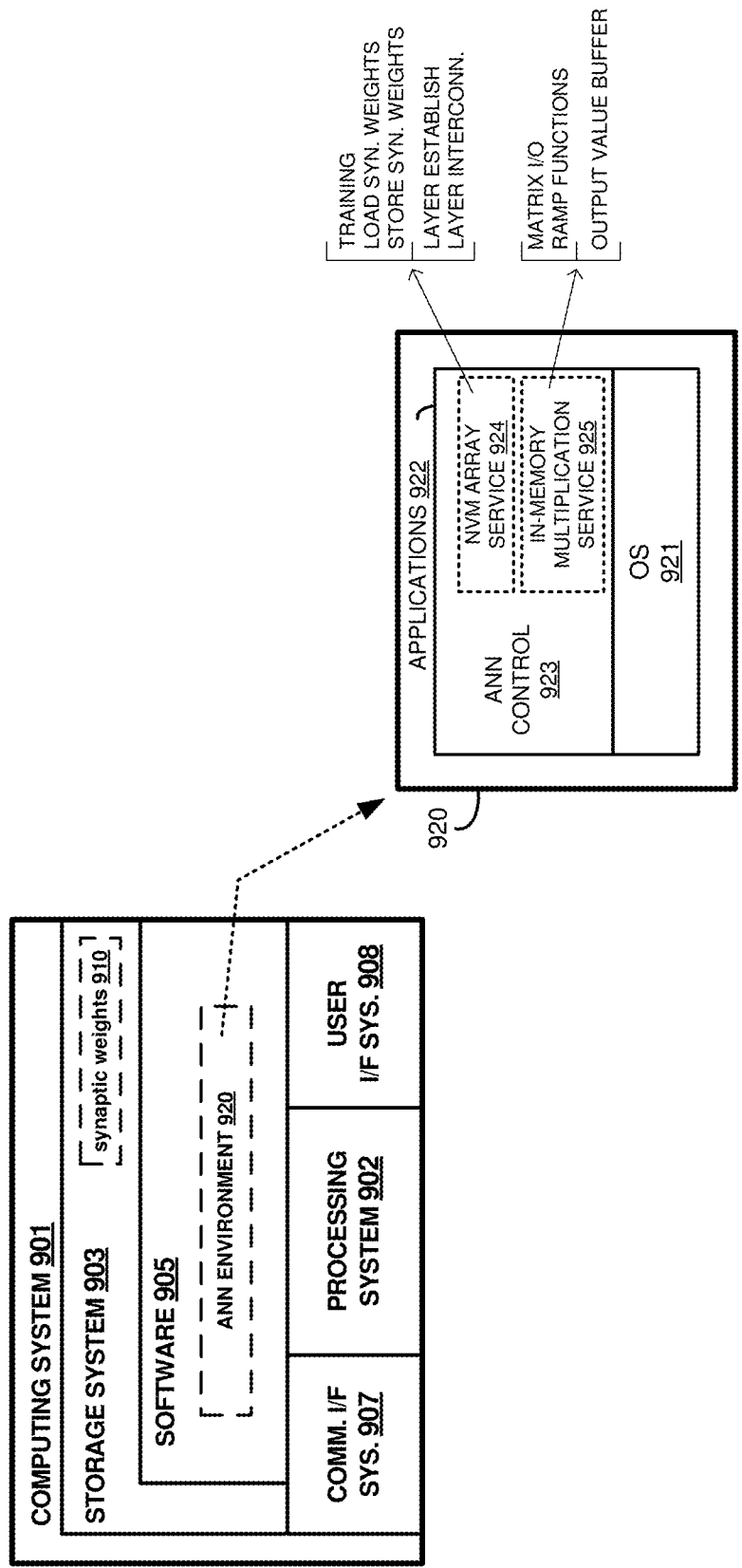
FIG. 9 illustrates a computing system to host or control an artificial neural network or matrix multiplier according to an implementation.

FIG. 9 illustrates computing system 901 that is representative of any system or collection of systems in which the various operational architectures, scenarios, and processes disclosed herein may be implemented. For example, computing system 901 can be used to implement control circuitry 130, interface circuitry 120, or a host system of FIG. 1, counter 630 of FIG. 6, adder 740 or counter 750 of FIG. 7, or any other instance of control circuitry, input circuitry, interface circuitry, or output circuitry discussed herein. Moreover, computing system 901 can be used to store and load synaptic weights into NVM cells, configure interconnect circuitry to establish one or more layers of an artificial neural network, and determine synaptic weights through training operations. In yet further examples, computing system 901 can fully implement an artificial neural network, such as that illustrated in FIG. 1, to create an at least partially software-implemented artificial neural network with enhanced in-memory multiplication. Computing system 901 can implement control of any of the enhanced in-memory multiplication operations discussed herein, whether implemented using hardware or software components, or any combination thereof.

Examples of computing system 901 include, but are not limited to, computers, smartphones, tablet computing devices, laptops, desktop computers, hybrid computers, rack servers, web servers, cloud computing platforms, cloud computing systems, distributed computing systems, software-defined networking systems, and data center equipment, as well as any other type of physical or virtual machine, and other computing systems and devices, as well as any variation or combination thereof.

Computing system 901 may be implemented as a single apparatus, system, or device or may be implemented in a distributed manner as multiple apparatuses, systems, or devices. Computing system 901 includes, but is not limited to, processing system 902, storage system 903, software 905, communication interface system 907, and user interface system 908. Processing system 902 is operatively coupled with storage system 903, communication interface system 907, and user interface system 908.

Processing system 902 loads and executes software 905 from storage system 903. Software 905 includes artificial neural network (ANN) environment 920, which is representative of the processes discussed with respect to the preceding Figures. When executed by processing system 902 to implement and enhance ANN operations, software 905 directs processing system 902 to operate as described herein for at least the various processes, operational scenarios, and sequences discussed in the foregoing implementations. Computing system 901 may optionally include additional devices, features, or functionality not discussed for purposes of brevity.

Referring still to FIG. 9, processing system 902 may comprise a microprocessor and processing circuitry that retrieves and executes software 905 from storage system 903. Processing system 902 may be implemented within a single processing device, but may also be distributed across multiple processing devices, sub-systems, or specialized circuitry, that cooperate in executing program instructions and in performing the operations discussed herein. Examples of processing system 902 include general purpose central processing units, application specific processors, and logic devices, as well as any other type of processing device, combinations, or variations thereof.

Storage system 903 may comprise any computer readable storage media readable by processing system 902 and capable of storing software 905, and capable of optionally storing synaptic weights 910. Storage system 903 may include volatile and nonvolatile, removable and non-removable media implemented in any method or technology for storage of information, such as computer readable instructions, data structures, program modules, or other data. Examples of storage media include random access memory, read only memory, magnetic disks, optical disks, flash memory, virtual memory and non-virtual memory, magnetic cassettes, magnetic tape, magnetic disk storage or other magnetic storage devices, resistive storage devices, magnetic random-access memory devices, phase change memory devices, or any other suitable non-transitory storage media.

In addition to computer readable storage media, in some implementations storage system 903 may also include computer readable communication media over which at least some of software 905 may be communicated internally or externally. Storage system 903 may be implemented as a single storage device, but may also be implemented across multiple storage devices or sub-systems co-located or distributed relative to each other. Storage system 903 may comprise additional elements, such as a controller, capable of communicating with processing system 902 or possibly other systems.

Software 905 may be implemented in program instructions and among other functions may, when executed by processing system 902, direct processing system 902 to operate as described with respect to the various operational scenarios, sequences, and processes illustrated herein. For example, software 905 may include program instructions for controlling and interfacing with enhanced in-memory multiplication circuitry, among other operations.

In particular, the program instructions may include various components or modules that cooperate or otherwise interact to carry out the various processes and operational scenarios described herein. The various components or modules may be embodied in compiled or interpreted instructions, or in some other variation or combination of instructions. The various components or modules may be executed in a synchronous or asynchronous manner, serially or in parallel, in a single threaded environment or multi-threaded, or in accordance with any other suitable execution paradigm, variation, or combination thereof. Software 905 may include additional processes, programs, or components, such as operating system software or other application software, in addition to or that include ANN environment 920. Software 905 may also comprise firmware or some other form of machine-readable processing instructions executable by processing system 902.

In general, software 905 may, when loaded into processing system 902 and executed, transform a suitable apparatus, system, or device (of which computing system 901 is representative) overall from a general-purpose computing system into a special-purpose computing system customized to facilitate controlling and interfacing with enhanced in-memory multiplication circuitry. Indeed, encoding software 905 on storage system 903 may transform the physical structure of storage system 903. The specific transformation of the physical structure may depend on various factors in different implementations of this description. Examples of such factors may include, but are not limited to, the technology used to implement the storage media of storage system 903 and whether the computer-storage media are characterized as primary or secondary storage, as well as other factors.

For example, if the computer readable storage media are implemented as semiconductor-based memory, software 905 may transform the physical state of the semiconductor memory when the program instructions are encoded therein, such as by transforming the state of transistors, capacitors, or other discrete circuit elements constituting the semiconductor memory. A similar transformation may occur with respect to magnetic or optical media. Other transformations of physical media are possible without departing from the scope of the present description, with the foregoing examples provided only to facilitate the present discussion.

ANN environment 920 includes one or more software elements, such as OS 921 and applications 922. These elements can describe various portions of computing system 901 with which elements of artificial neural networks or external systems can interface or interact. For example, OS 921 can provide a software platform on which application 922 is executed and allows for enhanced ANN operations and control and interfacing with enhanced in-memory multiplication circuitry.

In one example, NVM array service 924 implements and executes training operations of ANNs to determine synaptic weights for artificial neurons. NVM array service 924 can interface with NVM cells to load and store synaptic weights for use in inference operations and in-memory multiplication operations. Moreover, NVM array service 924 can establish layers among NVM cells to implement layers and nodes of an ANN, such as by controlling interconnect or interface circuitry. In further examples, NVM array service 924 receives intermediate values from intermediate or hidden layers and provides these intermediate values to subsequent layers. NVM array service 924 can implement softmax layers or softmax functions as well.

In another example, in-memory multiplication service 925 controls operation of an ANN that employs in-memory multiplication, as described herein. For example, in-memory multiplication service 925 can determine ramp rates based on input values of an input matrix to be multiplied. In-memory multiplication service 925 can determine threshold voltages to set for individual NVM memory cells based on a weight matrix or synaptic weights previously determined through ANN training operations. In-memory multiplication service 925 can monitor output states generated by NVM cells responsive to ramps used to control gate terminals of the NVM cells, or output pulses generated by sense amplifier circuitry couple to the NVM cells. In-memory multiplication service 925 might also implement counter functions to count output pulses over a period of time, as measured in clock cycles. Values for element of resultant multiplication products can be received by computing system 901 and buffered or otherwise stored by in-memory multiplication service 925. In-memory multiplication service 925 can transmit resultant multiplication products to one or more further systems over communication interface 907, or present the resultant multiplication products to one or more users over user interface system 908.

Communication interface system 907 may include communication connections and devices that allow for communication with other computing systems (not shown) over communication networks (not shown). Communication interface system 907 might also communicate with portions of hardware-implemented ANNs, such as with layers of ANNs, NVM-implemented weight arrays, ramp circuitry, adders, counters, or other ANN circuitry with enhanced in-memory multiplication. Examples of connections and devices that together allow for inter-system communication may include NVM memory interfaces, network interface cards, antennas, power amplifiers, RF circuitry, transceivers, and other communication circuitry. The connections and devices may communicate over communication media to exchange communications or data with other computing systems or networks of systems, such as metal, glass, air, or any other suitable communication media.

User interface system 908 is optional and may include a keyboard, a mouse, a voice input device, a touch input device for receiving input from a user. Output devices such as a display, speakers, web interfaces, terminal interfaces, and other types of output devices may also be included in user interface system 908. User interface system 908 can provide output and receive input over a data interface or network interface, such as communication interface system 907. User interface system 908 may also include associated user interface software executable by processing system 902 in support of the various user input and output devices discussed above. Separately or in conjunction with each other and other hardware and software elements, the user interface software and user interface devices may support a graphical user interface, a natural user interface, or any other type of user interface.

Communication between computing system 901 and other computing systems (not shown), may occur over a communication network or networks and in accordance with various communication protocols, combinations of protocols, or variations thereof. Examples include intranets, internets, the Internet, local area networks, wide area networks, wireless networks, wired networks, virtual networks, software defined networks, data center buses, computing backplanes, or any other type of network, combination of network, or variation thereof. The aforementioned communication networks and protocols are well known and need not be discussed at length here. However, some communication protocols that may be used include, but are not limited to, the Internet protocol (IP, IPv4, IPv6, etc.), the transmission control protocol (TCP), and the user datagram protocol (UDP), as well as any other suitable communication protocol, variation, or combination thereof.

The included descriptions and figures depict specific embodiments to teach those skilled in the art how to make and use the best mode. For the purpose of teaching inventive principles, some conventional aspects have been simplified or omitted. Those skilled in the art will appreciate variations from these embodiments that fall within the scope of the disclosure. Those skilled in the art will also appreciate that the features described above can be combined in various ways to form multiple embodiments. As a result, the invention is not limited to the specific embodiments described above, but only by the claims and their equivalents.

What is claimed is:

1. A circuit comprising:
    a non-volatile memory cell;
    an input circuit coupled to a gate terminal of the non-volatile memory cell and configured to ramp a gate voltage applied to the gate terminal at a ramp rate representing multiplicand value; and
    an output circuit coupled to an output terminal of the non-volatile memory cell and configured to generate an output pulse in response to the gate voltage satisfying a threshold voltage of the non-volatile memory cell, wherein the output pulse has a duration corresponding to the multiplicand value multiplied by a multiplier value represented by the threshold voltage.

2. The circuit of claim 1, wherein the non-volatile memory cell comprises a quad-level NOR flash memory cell, wherein the multiplicand value and the multiplier value each comprise a bit vector having a range of values corresponding to a quantity of storage states encoded by the threshold voltage of the quad-level NOR flash memory cell, and wherein the duration of the output pulse corresponds to a multiplication between a bit vector of the input value and a bit vector of the multiplier value.

3. The circuit of claim 1, comprising:
    the output circuit comprising a comparator coupled to the output terminal of the non-volatile memory cell and configured to produce the output pulse based on a comparison between a reference voltage and an output state of the non-volatile memory cell.

4. The circuit of claim 1, comprising:
    the input circuit configured to ramp the gate voltage from a program voltage of the non-volatile memory cell downward to a reference voltage of the circuit, wherein the ramp rate corresponds to an inverse of the multiplicand value scaled by a ramp time granularity.

5. The circuit of claim 4, wherein the duration of the output pulse corresponds to a time period during the ramp time when the gate voltage exceeds the threshold voltage of the non-volatile memory cell representing the multiplier value.

6. The circuit of claim 4, comprising:
    the output circuit configured to convert the output pulse into a digital representation based on the ramp time granularity applied to the duration of the output pulse.

* * * * *